United States Patent
Shibuta

(10) Patent No.: US 9,690,206 B2
(45) Date of Patent: Jun. 27, 2017

(54) SUBSTRATE HOLDING APPARATUS, EXPOSURE APPARATUS, AND DEVICE FABRICATING METHOD

(71) Applicant: NIKON CORPORATION, Tokyo (JP)

(72) Inventor: Makoto Shibuta, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/981,067

(22) Filed: Dec. 28, 2015

(65) Prior Publication Data

US 2016/0131981 A1 May 12, 2016

Related U.S. Application Data

(63) Continuation of application No. 11/792,924, filed as application No. PCT/JP2005/022968 on Dec. 14, 2005, now Pat. No. 9,224,632.

(30) Foreign Application Priority Data

Dec. 15, 2004 (JP) .................. 2004-363478

(51) Int. Cl.
  *G03B 27/52* (2006.01)
  *G03B 27/58* (2006.01)
  (Continued)

(52) U.S. Cl.
  CPC .......... *G03F 7/70341* (2013.01); *G03F 7/707* (2013.01); *G03F 7/70716* (2013.01);
  (Continued)

(58) Field of Classification Search
  CPC .................. G03F 7/70341; G03F 7/70716
  (Continued)

(56) References Cited

U.S. PATENT DOCUMENTS 3,955,163 A 5/1976 Novak
4,346,164 A 8/1982 Tabarelli et al.
(Continued)

FOREIGN PATENT DOCUMENTS

DE 221 563 A1 4/1985
DE 224 448 A1 7/1985
(Continued)

OTHER PUBLICATIONS

European Search Report issued in European Patent Application No. 05816647.1, dated Apr. 28, 2009.
(Continued)

*Primary Examiner* — Hung Henry Nguyen
(74) *Attorney, Agent, or Firm* — Oliff PLC

(57) ABSTRACT

An exposure apparatus exposes a substrate to light passing through liquid, and includes a stage that holds the substrate. The stage includes a substrate holder including a support member that supports a rear surface of the substrate and a first circumferential wall surrounding the support member. A second circumferential wall surrounds the substrate holder and forms a first groove between the second circumferential wall and the substrate holder, and a second groove on an outer side thereof. A plate member surrounds the substrate on the support member, and a recovery passage recovers liquid flowing from a liquid supply system to a gap between the plate member and the substrate. The second circumferential wall is under the gap so that part of an upper surface of the second circumferential wall faces the substrate rear surface and another part of the upper surface faces a rear surface of the plate member.

13 Claims, 21 Drawing Sheets

(51) Int. Cl.
  *G03F 7/20* (2006.01)
  *H01L 21/683* (2006.01)
  *H01L 21/687* (2006.01)

(52) U.S. Cl.
  CPC ...... *H01L 21/6838* (2013.01); *H01L 21/6875* (2013.01); *H01L 21/68735* (2013.01); *G03F 7/2041* (2013.01)

(58) Field of Classification Search
  USPC ........................................ 355/30, 53, 72–76
  See application file for complete search history.

(56) References Cited

U.S. PATENT DOCUMENTS

| | | | |
|---|---|---|---|
| 4,480,910 | A | 11/1984 | Takanashi et al. |
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |
| 5,874,820 | A | 2/1999 | Lee |
| 5,969,441 | A | 10/1999 | Loopstra et al. |
| 6,184,972 | B1 | 2/2001 | Mizutani et al. |
| 6,195,154 | B1 | 2/2001 | Imai |
| 6,341,007 | B1 | 1/2002 | Nishi et al. |
| 6,400,441 | B1 | 6/2002 | Nishi et al. |
| 6,513,796 | B2 | 2/2003 | Leidy et al. |
| 6,778,257 | B2 | 8/2004 | Bleeker et al. |
| 7,199,858 | B2 | 4/2007 | Lof et al. |
| 7,362,412 | B2 * | 4/2008 | Holmes ............... G03F 7/70341 134/1.3 |
| 9,224,632 | B2 | 12/2015 | Shibuta |
| 2004/0160582 | A1 | 8/2004 | Lof et al. |
| 2004/0165159 | A1 | 8/2004 | Lof et al. |
| 2005/0219488 | A1 | 10/2005 | Nei et al. |
| 2005/0280791 | A1 | 12/2005 | Nagasaka et al. |
| 2006/0139614 | A1 | 6/2006 | Owa et al. |
| 2007/0109521 | A1 | 5/2007 | Nishii et al. |
| 2007/0115450 | A1 | 5/2007 | Nagasaka et al. |

FOREIGN PATENT DOCUMENTS

| | | |
|---|---|---|
| EP | 1 420 298 A2 | 5/2004 |
| EP | 1429188 A2 | 6/2004 |
| EP | 1 598 855 A1 | 11/2005 |
| EP | 1788617 A1 | 5/2007 |
| EP | 1801850 A1 | 6/2007 |
| JP | S58-202448 A | 11/1983 |
| JP | S59-019912 A | 2/1984 |
| JP | 62-065326 A | 3/1987 |
| JP | S63-157419 A | 6/1988 |
| JP | H04-305915 A | 10/1992 |
| JP | H04-305917 A | 10/1992 |
| JP | H05-62877 A | 3/1993 |
| JP | H06-124873 A | 5/1994 |
| JP | H07-220990 A | 8/1995 |
| JP | H08-037149 A | 2/1996 |
| JP | H08-166475 A | 6/1996 |
| JP | H08-316125 A | 11/1996 |
| JP | H08-330224 A | 12/1996 |
| JP | H10-163099 A | 6/1998 |
| JP | H10-214783 A | 8/1998 |
| JP | H10-303114 A | 11/1998 |
| JP | H10-340846 A | 12/1998 |
| JP | H11-135400 A | 5/1999 |
| JP | H11-176727 A | 7/1999 |
| JP | 2000-058436 A | 2/2000 |
| JP | 2000-505958 A | 5/2000 |
| JP | 2004-289127 A | 10/2004 |
| KR | 10-2004-0044128 A | 5/2004 |
| WO | 99/49504 A1 | 9/1999 |
| WO | 01/35168 A1 | 5/2001 |
| WO | 2004/019128 A2 | 3/2004 |
| WO | 2004/086468 A1 | 10/2004 |
| WO | 2004/093160 A2 | 10/2004 |
| WO | 2005/010611 A2 | 2/2005 |
| WO | 2005122219 A1 | 12/2005 |

OTHER PUBLICATIONS

European Office Action issued in European Patent Application No. 05816647.1, dated Aug. 26, 2009.
Israeli Office Action issued in Israeli Patent Application No. 183882, dated Jul. 19, 2010.
Australian Office Action issued in Singapore Patent Application No. 0704367-2, dated Aug. 15, 2008.
International Search Report issued in Patent Application No. PCT/JP2005/022968, dated Mar. 20, 2006.
Nritten Opinion of the International Searching Authority issued in Patent Application No. PCT/JP2005/022968, dated Mar. 20, 2006.
Apr. 25, 2011 Office Action issued in European Patent Application No. 05816647.1.
Mar. 29, 2011 Office Action issued in Japanese Patent Application No. 2006-548888.
Korean Patent Office, Notice of Grounds for Rejection mailed on Aug. 1, 2012 in Korean Patent Application No. 2007-7004198.
Japanese Patent Office, Notice of Reasons for Rejection mailed Mar. 6, 2012 in Japanese Patent Application No. 2006-548888.
Taiwanese Patent Office, Examination Report mailed Apr. 11, 2012 in Taiwanese Patent Application No. 094144222.
Dec. 18, 2012 Office Action issued in Japanese Patent Application No. 2011-121109.
Dec. 11, 2012 Office Action issued in Taiwanese Patent Application No. 094144222.
Sep. 26, 2013 Office Action issued in Indian Patent Application No. 2363/KOLNP/2007.
Jun. 9, 2011 Office Action issued in U.S. Appl. No. 11/792,924.
Apr. 26, 2012 Office Action issued in U.S. Appl. No. 11/792,924.
Dec. 20, 2012 Office Action issued in U.S. Appl. No. 11/792,924.
Oct. 18, 2013 Office Action issued in U.S. Appl. No. 11/792,924.
May 14, 2014 Office Action issued in U.S. Appl. No. 11/792,924.
Mar. 27, 2015 Office Action issued in U.S. Appl. No. 11/792,924.
Aug. 19, 2015 Notice of Allowance issued in U.S. Appl. No. 11/792,924.
Apr. 28, 2016 Search Report issued in European Patent Application No. 15178030.1.
Jul. 25, 2016 Office Action issued in Korean Patent Application No. 10-2015-7017190.

* cited by examiner

SUBSTRATE HOLDING APPARATUS, EXPOSURE APPARATUS, AND DEVICE FABRICATING METHOD

This is a Continuation of U.S. application Ser. No. 11/792,924 filed Jun. 13, 2007 which is now U.S. Pat. No. 9,224,632, which in turn is a U.S. National Stage of International Application No. PCT/JP05/022968 filed Dec. 14, 2005, which claims priority to Japanese Patent Application No. 2004-363478, filed on Dec. 15, 2004. The disclosure of each of the prior applications is hereby incorporated by reference herein in its entirety.

TECHNICAL FIELD

The present invention relates to a substrate holding apparatus that holds a substrate to be processed, an exposure apparatus that exposes a substrate to be processed, and a device fabricating method.

BACKGROUND ART

The photolithographic process, which is one of the processes for manufacturing microdevices such as semiconductor devices and liquid crystal display devices, uses an exposure apparatus that projects the image of a pattern formed on a mask onto a photosensitive substrate. This exposure apparatus comprises a mask stage that supports a mask as well as a substrate stage that supports a substrate, and projects an image of the pattern of the mask onto the substrate through a projection optical system while successively moving the mask stage and the substrate stage. In the field of microdevice fabrication, there is demand to increase the fineness of the patterns formed on substrates in order to increase device density. There is also demand to increase the resolution of exposure apparatuses in order to meet this need; furthermore, as one means to achieve that increased resolution, an immersion exposure apparatus has been proposed that performs an exposure process in a state wherein a liquid, which has a refractive index higher than that of a gas, is filled between the projection optical system and the substrate, as disclosed in Patent Document 1 below.

Patent Document 1 PCT International Publication No. WO99/49504

Patent Document 2 Japanese Unexamined Patent Application, Publication No. 2004-289127

DISCLOSURE OF INVENTION

Problems to be Solved by the Invention

If the liquid infiltrates the rear surface side of the substrate through, for example, a gap between the substrate and the substrate stage, then there is a possibility that various problems will occur. For example, if the liquid that infiltrates the rear surface side of the substrate wets such, then there is a risk that the substrate holder (substrate holding apparatus) will no longer be able to be satisfactorily hold the substrate. Alternatively, when a prescribed transport system is used to unload the substrate from the substrate holder, there is also a risk that, for example, the liquid will adhere to the transport system that holds the wet rear surface of the substrate, or that the liquid will scatter to the transport pathway, thereby causing further damage.

A purpose of some aspects of the invention is to provide a substrate holding apparatus and an exposure apparatus that, even if liquid has infiltrated the rear surface side of a substrate, can rapidly recover that infiltrated liquid, and a device fabrication method that uses this exposure apparatus.

Means for Solving the Problem

A first aspect of the present invention provides a substrate holding apparatus that holds a substrate to be processed, wherein an immersion area of a liquid is formed on a front surface, comprising: a base; a first support part, which is formed on the base and supports a rear surface of the substrate to be processed; a first circumferential wall part, which is formed on the base and is provided so that it opposes the rear surface of the substrate to be processed and surrounds the first support part; and a first recovery port, which is provided on the outer side of the first circumferential wall part; wherein, the flow of a gas along the first circumferential wall part moves the liquid on the outer side of the first circumferential wall part to the first recovery port, where the liquid is recovered.

According to the first aspect of the present invention, the flow of the gas along the first circumferential wall part moves the liquid on the outer side of the first circumferential wall part to the first recovery port; therefore, even if the liquid infiltrates to the rear surface side of the substrate, that liquid can be rapidly recovered using the first recovery port.

A second aspect of the present invention provides an exposure apparatus, comprising: a substrate holding apparatus according to the abovementioned aspect, wherein a substrate to be processed, which is held by the substrate holding apparatus, is exposed through a liquid.

According to the second aspect of the present invention, the infiltrated liquid can be rapidly recovered, which makes it possible to satisfactorily expose the substrate to be processed.

A third aspect of the present invention provides a device fabricating method, wherein an exposure apparatus according to the abovementioned aspects is used.

According to the third aspect of the present invention, a device can be fabricated using an exposure apparatus that can satisfactorily expose a substrate to be processed.

Advantage of the Invention

According to the present invention, even if liquid infiltrates the rear surface side of a substrate to be processed, that infiltrated liquid can be rapidly recovered. In addition, the substrate to be processed can be satisfactorily exposed.

BEST MODE FOR CARRYING OUT THE INVENTION

The following explains the embodiments of the present invention, referencing the drawings, but the present invention is not limited thereto.

First Embodiment

Figure 1:
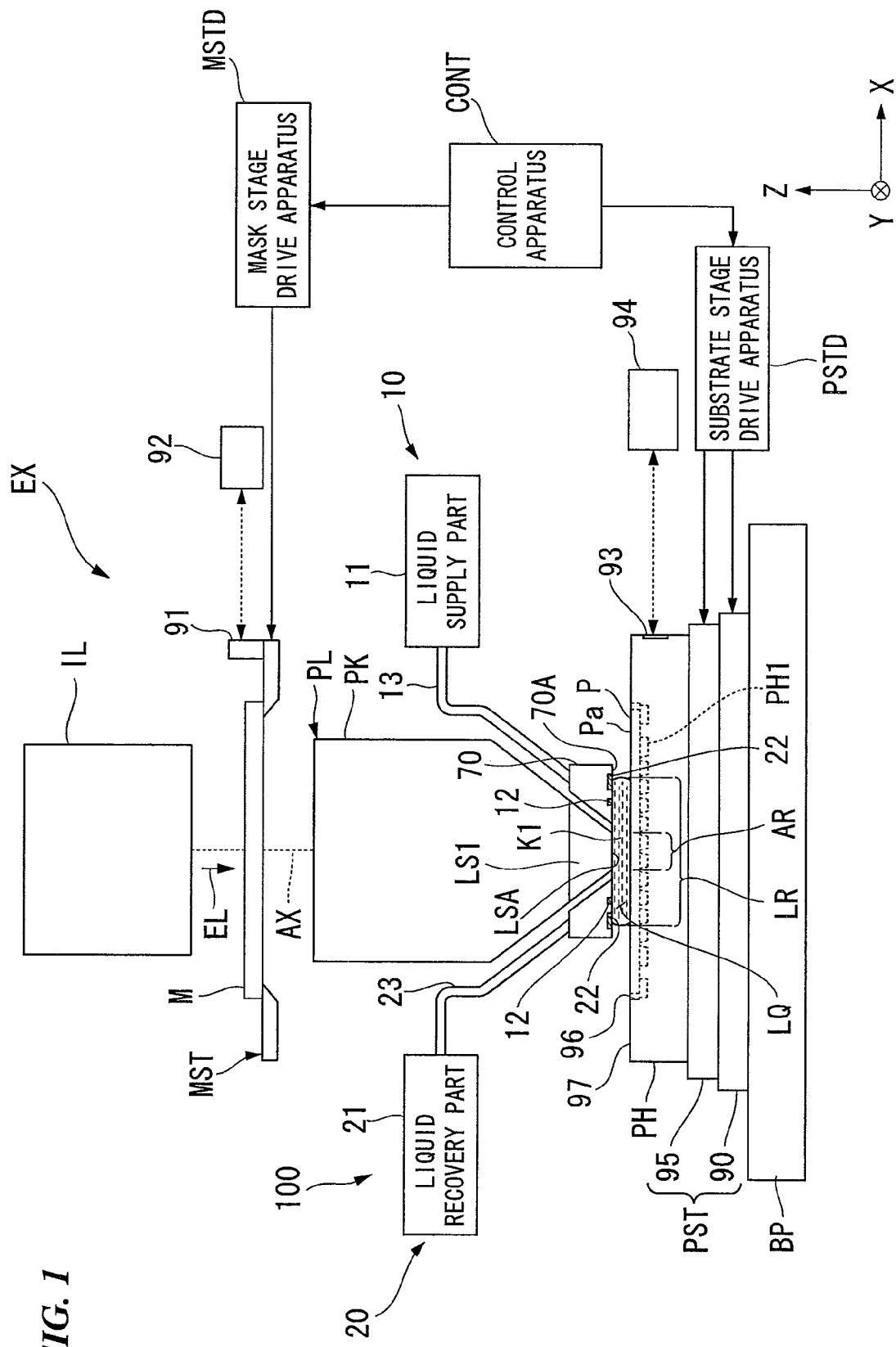
FIG. 1 is a schematic block diagram that shows the exposure apparatus according to a first embodiment.

The first embodiment of the present invention will now be explained referencing FIG. 1. FIG. 1 is a schematic block diagram that shows an exposure apparatus EX according to the first embodiment. In FIG. 1, the exposure apparatus EX comprises a mask stage MST, which is capable of holding and moving a mask M; a substrate holder PH, which holds a substrate P; a substrate stage PST, which is capable of moving the substrate holder PH that holds the substrate P; an illumination optical system IL, which illuminates the mask M supported by the mask stage MST with exposure light EL; a projection optical system PL, which projects a pattern image of the mask M illuminated by the exposure light EL onto the substrate P; and a control apparatus CONT, which provides supervisory control of the entire operation of the exposure apparatus EX.

The exposure apparatus EX of the present embodiment is a liquid immersion exposure apparatus that employs the liquid immersion method to substantially shorten the exposure wavelength, improve the resolution, as well as substantially increase the depth of focus, and comprises a liquid immersion mechanism 100 for filling a liquid LQ in an optical path space K1 in the optical path of the exposure light EL on the image plane side of the projection optical system PL. The liquid immersion mechanism 100 comprises: a nozzle member 70, which is provided in the vicinity of the image plane of the projection optical system PL, that has supply ports 12 that supply the liquid LQ and recovery ports 22 that recover such; a liquid supply mechanism 10 that supplies the liquid LQ to the optical path space K1 on the image plane side of the projection optical system PL through the supply ports 12 provided to the nozzle member 70; and a liquid recovery mechanism 20 that recovers the liquid LQ on the image plane side of the projection optical system PL through the recovery ports 22 provided to the nozzle member 70. The nozzle member 70 is annularly formed above the substrate P (substrate holder PH) so that it surrounds a first optical element LS1, which is the element of the plurality of optical elements that constitute the projection optical system PL that is closest to the image plane of the projection optical system PL.

At least during the projection of the image of the pattern of the mask M onto the substrate P, the exposure apparatus EX employs a local liquid immersion system that uses the liquid LQ supplied by the liquid supply mechanism 10 to locally form the liquid LQ liquid immersion region LR, which is larger than a projection area AR and smaller than the substrate P, on one part of the substrate P that includes the projection area AR of the projection optical system PL. Specifically, the exposure apparatus EX uses the liquid immersion mechanism 100 to fill the liquid LQ in the optical path space K1 of the exposure light EL between a lower surface LSA of the first optical element LS1, which is closest to the image plane of the projection optical system PL, and a front surface Pa of the substrate P, which is disposed on the image plane side of the projection optical system PL and held by the substrate holder PH, and then exposes the substrate P with an image of the pattern of the mask M by irradiating the substrate P with the exposure light EL that passes through the mask M via the projection optical system PL and the liquid LQ between the projection optical system PL and the substrate P. The control apparatus CONT fills the liquid LQ in the optical path space K1 of the exposure light EL between the projection optical system PL and the substrate P to locally form the liquid immersion region LR of the liquid LQ on the substrate P by using the liquid supply mechanism 10 to supply a prescribed amount of the liquid LQ onto the substrate P, and by using the liquid recovery mechanism 20 to recover a prescribed amount of the liquid LQ on the substrate P.

The present embodiment will now be explained by taking as an example a case of using a scanning type exposure apparatus (a so-called scanning stepper) as the exposure apparatus EX that projects an image of the pattern formed on the mask M onto the substrate P while synchronously moving the mask M and the substrate P in their respective scanning directions. In the following explanation, the directions in which the mask M and the substrate P synchronously move (scanning directions) within the horizontal plane are the X axial directions, the directions orthogonal to the X axial directions within the horizontal plane are the Y axial directions (non-scanning directions), and the directions perpendicular to the X axial and the Y axial directions and that coincide with an optical axis AX of the projection optical system PL are the Z axial directions. In addition, the rotational (inclined) directions about the X, Y, and Z axes are the θX, θY, and θZ directions, respectively. Furthermore, "substrate" herein includes, for example, a semiconductor wafer that is coated with a photosensitive material (photoresist), and "mask" includes a reticle wherein a device pattern is formed that is reduction projected onto the substrate.

The illumination optical system IL comprises: an exposure light source; an optical integrator that uniformizes the luminous flux intensity of the light beam emitted from the exposure light source; a condenser lens that condenses the exposure light EL from the optical integrator; a relay lens system; and a field stop that sets an illumination region on the mask M illuminated by the exposure light EL. The illumination optical system IL illuminates the prescribed illumination region on the mask M with the exposure light EL, which has a uniform luminous flux intensity distribution. Examples of light that can be used as the exposure light EL emitted from the illumination optical system IL include: deep ultraviolet light (DUV light) such as bright line (g-line, h-line, or i-line) light emitted from, for example, a mercury lamp, and KrF excimer laser light (248 nm wavelength); and vacuum ultraviolet light (VUV light) such as ArF excimer laser light (193 nm wavelength) and $F_2$ laser light (157 nm wavelength). ArF excimer laser light is used in the present embodiment.

In the present embodiment, pure water is used as the liquid LQ. Pure water is capable of transmitting not only ArF excimer laser light, but also DUV light such as bright line (g-line, h-line, or i-line) light emitted from, for example, a mercury lamp and KrF excimer laser light (248 nm wavelength).

The mask stage MST, which is capable of holding and moving the mask M. The mask stage MST holds the mask M via vacuum chucking (or electrostatic chucking). The mask stage MST, in a state wherein it is holding the mask M, can be moved in two dimensions within a plane that is perpendicular to the optical axis AX of the projection optical system PL, i.e., within the XY plane, and can be finely rotated in the θZ direction by the drive of a mask stage drive apparatus MSTD, which includes a linear motor that is controlled by the control apparatus CONT. Movable mirrors 91 are provided on the mask stage MST. In addition, a laser interferometer 92 is provided at a position opposing each movable mirror 91. The laser interferometers 92 measure in real time the position of the mask M on the mask stage MST in the two dimensional directions, as well as the rotational angle in the θZ directions (depending on the case, including the rotational angles in the θX and θY directions). The measurement results of the laser interferometers 92 are outputted to the control apparatus CONT. Based on the measurement results of the laser interferometers 92, the control apparatus CONT controls the position of the mask M, which is held by the mask stage MST, by driving the mask stage drive apparatus MSTD.

The projection optical system PL exposes the substrate P by projecting the pattern of the mask M thereon at a prescribed projection magnification 13, and comprises a plurality of optical elements, which are held by a lens barrel PK. In the present embodiment, the projection optical system PL is a reduction system that has a projection magnification β of, for example, ¼, ⅕ or ⅛. Furthermore, the projection optical system PL may also be a unity magnification system or an enlargement system. In addition, the projection optical system PL may be: a dioptric system that does not include reflecting optical elements; a catoptric system that does not include refracting optical elements; or a catadioptric system that includes both reflecting optical elements and refracting optical elements. In addition, in the present embodiment, the first optical element LS1, which is the element of the plurality of optical elements that constitute the projection optical system PL that is closest to the image plane of the projection optical system PL, protrudes from the lens barrel PK.

The substrate stage PST is capable of moving the substrate holder PH, which holds the substrate P, on the image plane side of the projection optical system PL. The substrate stage PST comprises a Z tilt stage 95, which supports the substrate holder PH, and an XY stage 90, which supports the Z tilt stage 95. The XY stage 90 is movably supported on a base BP.

The substrate holder PH is supported on the Z tilt stage 95 and holds the substrate P via, for example, vacuum chucking. A recessed part 96 is provided in the upper surface of the substrate holder PH. A first holding part PH1 (discussed in detail later), which is for holding the substrate P, is disposed in the recessed part 96. Furthermore, an upper surface 97 of the substrate holder PH is formed around the recessed part 96 as a flat surface (flat part) so that it is at substantially the same height as (flush with) the front surface Pa of the substrate P held by the first holding part PH1. Furthermore, if it is possible to continue to fill the liquid LQ in the optical path space K1 on the image plane side of the projection optical system PL, then there may be a step between the front surface Pa of the substrate P held by the first holding part PH1 and the upper surface 97 of the substrate holder PH.

A substrate stage drive apparatus PSTD drives the substrate stage PST. The substrate stage drive apparatus PSTD comprises an XY drive mechanism, which includes a linear motor and the like and moves the XY stage 90 on the base BP in the X and Y axial directions and the θZ directions, and a Z drive mechanism, which includes a voice coil motor and the like and moves the Z tilt stage 95 in the Z axial directions and the θX and θY directions. The front surface Pa of the substrate P held by the substrate holder PH can move in the directions of six degrees of freedom, i.e., the X, Y, and Z axial directions and the θX, θY, and θZ directions, by the drive of the Z tilt stage 95 and the XY stage 90. Movable mirrors 93 are provided to side surfaces of the substrate holder PH. In addition, a laser interferometer 94 is provided at a position opposing each movable mirror 93. The laser interferometers 94 measure in real time the position of the substrate P on the substrate holder PH in the two dimensional directions as well as the rotational angle. In addition, the exposure apparatus EX comprises an oblique incidence type focus leveling detection system (not shown) that detects surface position information of the upper surface Pa of the substrate P that is supported by the substrate holder PH as disclosed in, for example, Japanese Unexamined Patent Application, Publication No. H08-837149. Before and during the exposure, the focus leveling detection system detects the surface position information (positional information in the Z axial directions, and inclination information in the θX and θY directions) of the upper surface Pa of the substrate P. Furthermore, the focus leveling detection system may also employ a system that uses an electrostatic capacitance type sensor. The measurement results of the laser interferometers 94 are output to the control apparatus CONT. The detection results of the focus leveling detection system are also output to the control apparatus CONT. Based on the detection results of the focus leveling detection system, the control apparatus CONT aligns the upper surface Pa of the substrate P with the image plane of the projection optical system PL by driving the substrate stage drive apparatus PSTD and controlling the focus position (Z position) and inclination angle (θX and θY) of the substrate P; in addition, based on the measurement results of the laser interferometers 94, the control apparatus CONT controls the position of the substrate P in the X and Y axial directions and the θZ directions.

The liquid supply mechanism 10 and the liquid recovery mechanism 20 of the liquid immersion mechanism 100 will now be explained. The liquid supply mechanism 10 supplies the liquid LQ to the image plane side of the projection optical system PL and comprises a liquid supply part 11, which is capable of feeding the liquid LQ, as well as a supply pipe 13, one end of which is connected to the liquid supply part 11. Another end of the supply pipe 13 is connected to the nozzle member 70. An internal passageway (supply passageway) that connects the supply ports 12 and the other end of the supply pipe 13 is formed inside the nozzle member 70. The liquid supply part 11 comprises, for example, a tank that stores the liquid LQ, a pressure pump, a temperature adjusting mechanism that adjusts the temperature of the supplied liquid LQ, and a filter unit that removes foreign matter from the liquid LQ. The control apparatus CONT controls the liquid supply operation of the liquid supply part 11. Furthermore, the tank, the pressure pump, the temperature adjusting mechanism, the filter unit, etc. of the liquid supply mechanism 10 do not all need to be provided to the exposure apparatus EX, and may be substituted with equipment at, for example, the plant where the exposure apparatus EX is installed.

The liquid recovery mechanism 20 recovers the liquid LQ on the image plane side of the projection optical system PL and comprises: a liquid recovery part 21 that is capable of recovering the liquid LQ; and a recovery pipe 23, one end of which is connected to the liquid recovery part 21. Another end of the recovery pipe 23 is connected to the nozzle member 70. An internal passageway (recovery passageway) that connects the recovery ports 22 with the other end of the recovery pipe 23 is formed inside the nozzle member 70. The liquid recovery part 21 is provided with, for example: a vacuum system (a suction apparatus) such as a vacuum pump; a gas-liquid separator that separates the recovered liquid LQ and a gas; and a tank that stores the recovered liquid LQ. Furthermore, the vacuum system, the gas-liquid separator, the tank, etc. of the liquid recovery mechanism 20 do not all need to be provided to the exposure apparatus EX, and may be substituted with equipment at, for example, the plant where the exposure apparatus EX is installed.

The supply ports 12, which supply the liquid LQ, and the recovery ports 22, which recover the liquid LQ, are formed in a lower surface 70A of the nozzle member 70. The lower surface 70A of the nozzle member 70 is provided at a position that opposes the upper surface Pa of the substrate P and the upper surface 97 of the substrate holder PH. The nozzle member 70 is an annular member that is provided so that it surrounds a side surface of the first optical element LS1, and a plurality of the supply ports 12 are provided in the lower surface 70A of the nozzle member 70 so that it surrounds the first optical element LS1 of the projection optical system PL (the optical axis AX of the projection optical system PL). In addition, the recovery ports 22 are provided in the lower surface 70A of the nozzle member 70 on the outer side of the supply ports 12 with respect to the first optical element LS1, and are provided so that they surround the first optical element LS1 and the supply ports 12.

When forming the liquid immersion region LR of the liquid LQ, the control apparatus CONT drives the liquid supply part 11 and the liquid recovery part 21. When the liquid LQ is fed from the liquid supply part 11 under the control of the control apparatus CONT, it flows through the supply pipe 13 and then is supplied through the supply passageway of the nozzle member 70 to the image plane side of the projection optical system PL from the supply ports 12. In addition, when the liquid recovery part 21 is driven under the control of the control apparatus CONT, the liquid LQ on the image plane side of the projection optical system PL flows into the recovery passageway of the nozzle member 70 through the recovery ports 22, flows through the recovery pipe 23, and is then recovered by the liquid recovery part 21.

When performing an immersion exposure of the substrate P, the control apparatus CONT exposes the substrate P by using the liquid immersion mechanism 100 to fill the liquid LQ in the optical path space K1 of the exposure light EL between the projection optical system PL and the substrate P held by the substrate holder PH, and then radiating the exposure light EL onto the substrate P through the projection optical system PL and the liquid LQ.

Figure 2:
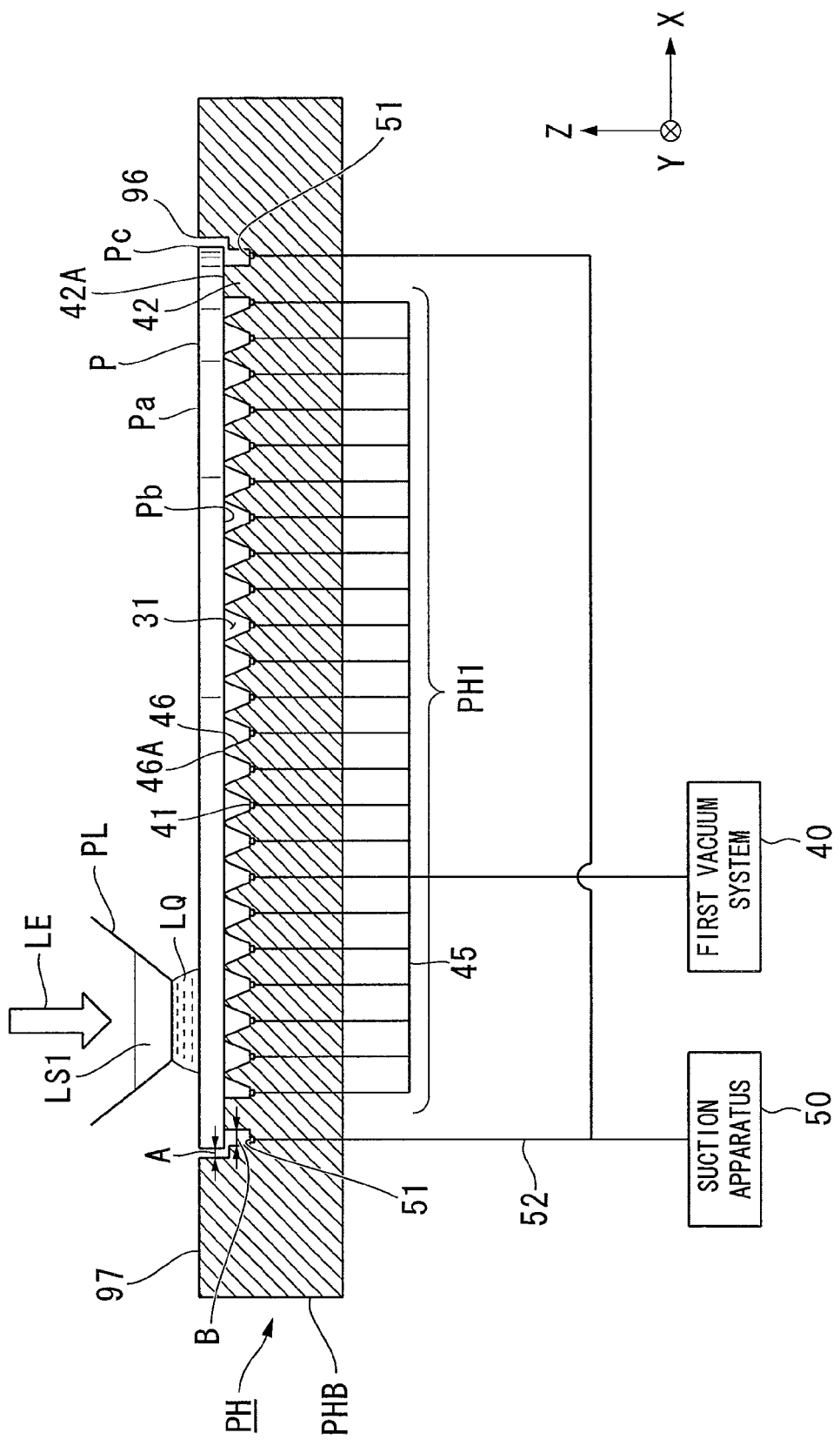
FIG. 2 is a side cross sectional view of the substrate holder according to the first embodiment.
Figure 3:
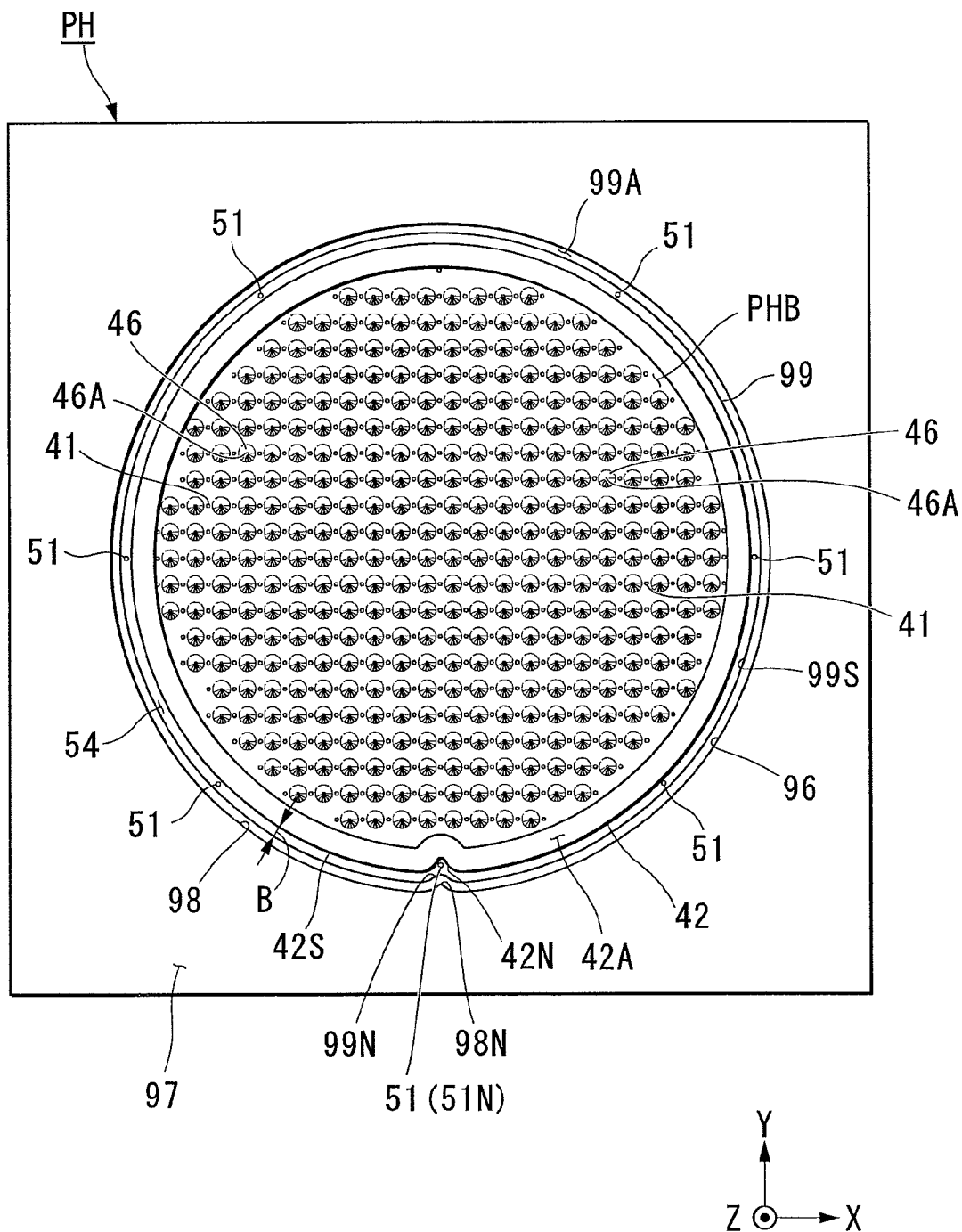
FIG. 3 is a plan view of the substrate holder according to the first embodiment.
Figure 4:
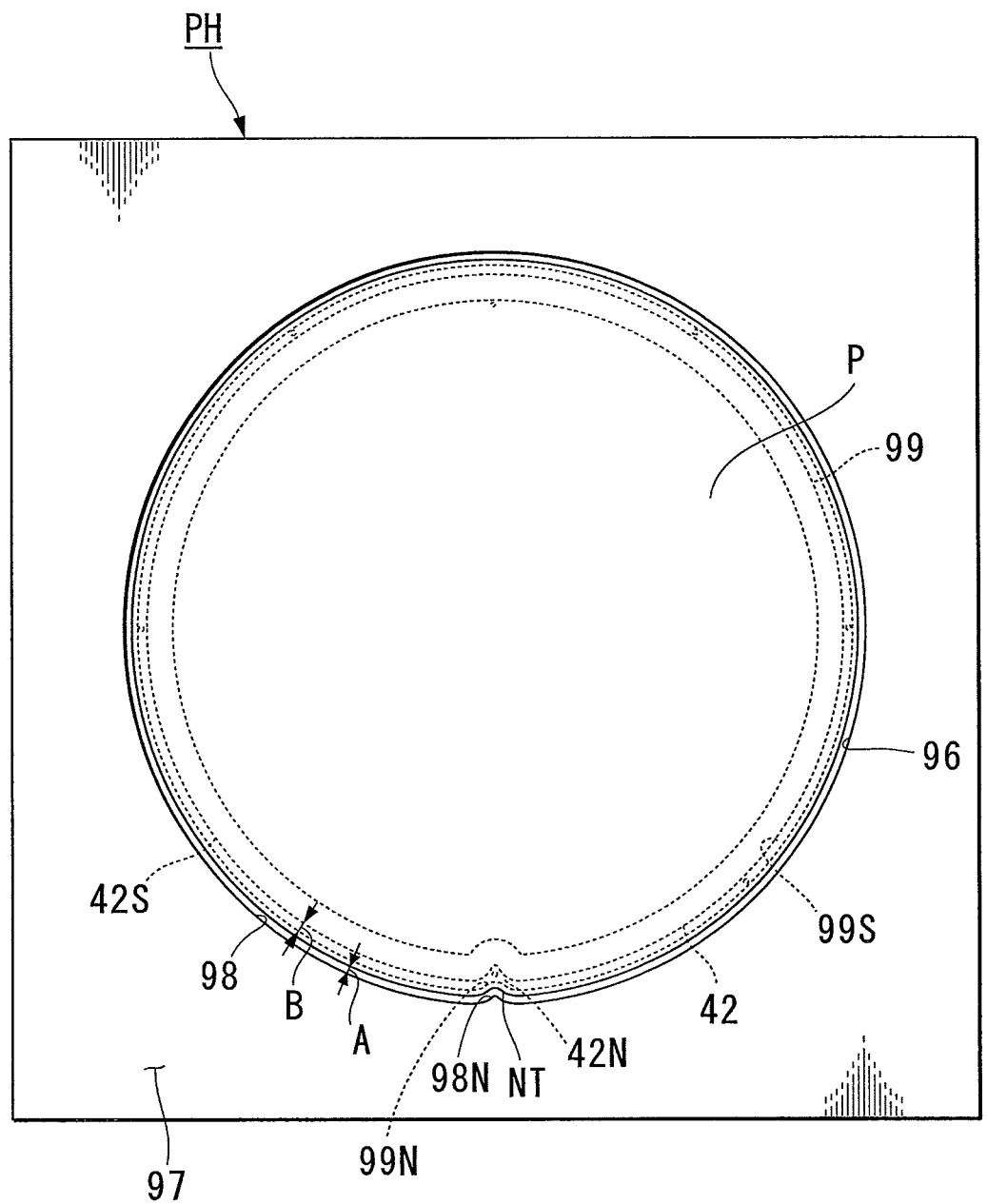
FIG. 4 is a plan view that shows a state wherein the substrate holder according to the first embodiment is holding a substrate.
Figure 5:
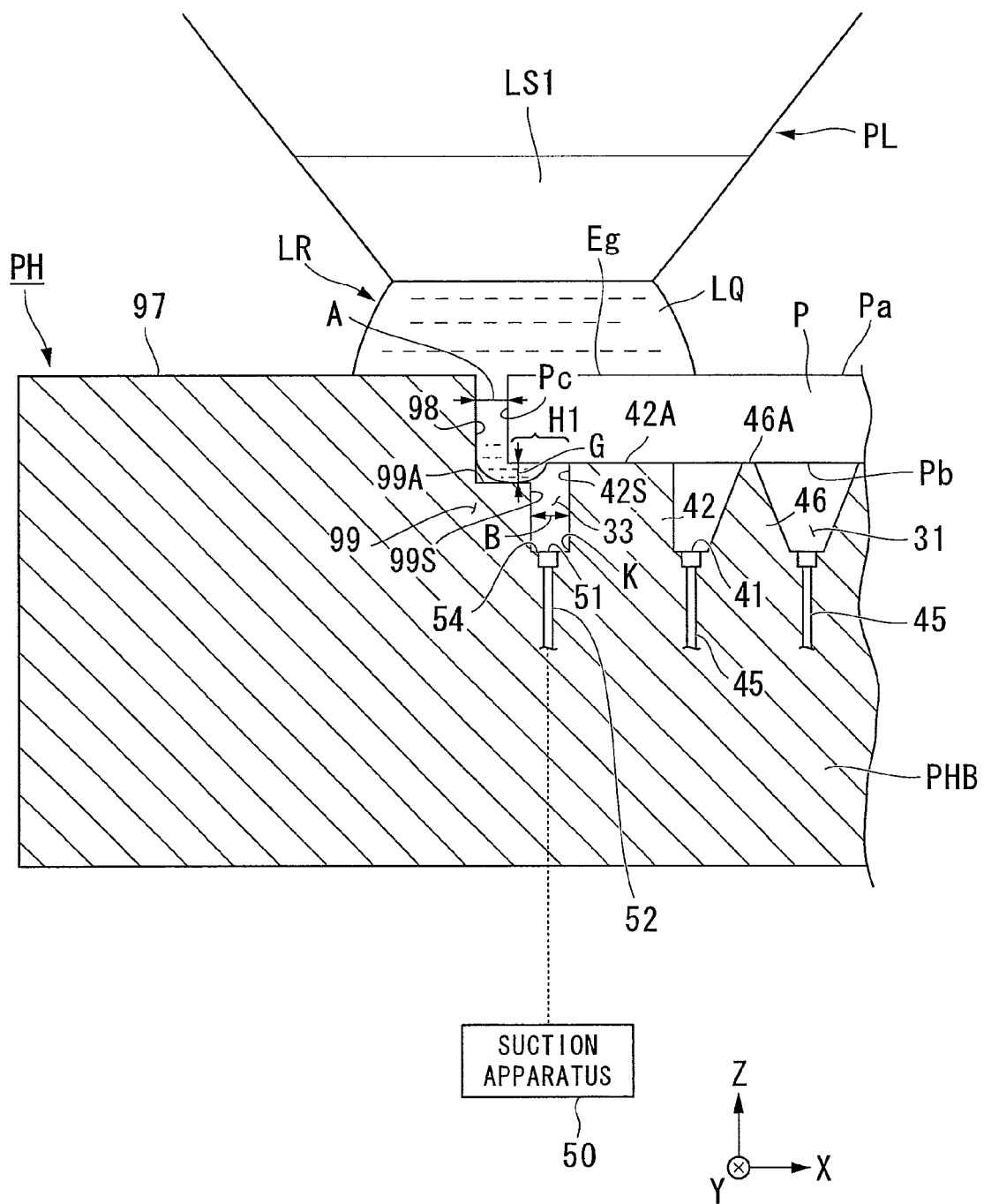
FIG. 5 is an enlarged view of the principal parts of FIG. 2.

The following explains the substrate holder PH referencing FIG. 2 and FIG. 5. FIG. 2 is a side cross sectional view of the substrate holder PH in a state wherein it is holding a substrate P; FIG. 3 is a plan view of the substrate holder PH; FIG. 4 is a plan view of the substrate holder PH in a state wherein it is holding a substrate P; and FIG. 5 is an enlarged view of the principal parts of FIG. 2.

The substrate holder PH comprises a base PHB and the first holding part PH1, which is formed in the base PHB and chucks the substrate P. The first holding part PH1 of the substrate holder PH comprises first support parts 46, which are formed on the base PHB and support a rear surface Pb of the substrate P, and a first circumferential wall part 42, which is formed on the base PHB and is provided so that it opposes the rear surface Pb of the substrate P and surrounds the first support parts 46. The first holding part PH1 is disposed on the inner side of the recessed part 96, which is formed in the substrate holder PH.

Each first support part 46 is formed as a protrusion and has an upper surface 46A that supports the rear surface Pb of the substrate P. In the present embodiment, the first support parts 46 comprise multiple support pins, which are uniformly formed on the inner side of the first circumferential wall part 42. In accordance with the shape of the substrate P, the first circumferential wall part 42 is formed as a substantially circular ring, and an upper surface 42A of the first circumferential wall part 42 is provided so that it opposes a circumferential edge area (edge area) of the rear surface Pb of the substrate P. The upper surface 42A of the first circumferential wall part 42 is a flat surface. In the present embodiment, the upper surface 46A of each first support part 46 is formed so that it is either the same height as or slightly higher than the upper surface 42A of the first circumferential wall part 42. Furthermore, a first space 31, which is surrounded by the substrate P, the first circumferential wall part 42, and the base PHB, is formed on the rear surface Pb side of the substrate P held by the first holding part PH1.

First suction ports 41 are formed on the base PHB on the inner side of the first circumferential wall part 42. The first suction ports 41 are for chucking the substrate P, and are provided at a plurality of prescribed positions on the upper surface of the base PHB, excluding the areas where the first support parts 46 are provided, on the inner side of the first circumferential wall part 42. In the present embodiment, multiple first suction ports 41 are uniformly disposed on the inner side of the first circumferential wall part 42. Each first suction port 41 is connected to a first vacuum system 40 through a passageway 45. The first vacuum system 40 includes a vacuum pump and is for negatively pressurizing the first space 31, which is surrounded by the substrate P, the first circumferential wall part 42, and the base PHB. As discussed above, the first support parts 46 comprise support pins, and the first holding part PH1 according to the present embodiment constitutes one part of a so-called pin chuck mechanism. The control apparatus CONT drives the first vacuum system 40 to suction the gas (air) out of the first space 31, which is surrounded by the substrate P, the first circumferential wall part 42 and the base PHB, to negatively pressurize the first space 31, thereby chucking the rear surface Pb of the substrate P via the first support parts 46.

As shown in FIG. 5, an inner side surface 98, which is connected to the upper surface 97 and opposes a side surface Pc of the substrate P chucked by the first holding part PH1, is formed on the inner side of the recessed part 96 of the substrate holder PH. Furthermore, a prescribed gap A is formed between an edge part of the substrate P held by the first holding part PH1 and the inner side surface 98 (upper surface 97) provided at the circumference of that substrate P. In the present embodiment, the gap A is approximately 0.1-1.0 mm.

In addition, as shown in FIG. 5, a step part 99 is formed along an outer side surface of the first circumferential wall part 42 on the inner side of the recessed part 96 of the substrate holder PH. The step part 99 comprises an upper surface 99A, which is substantially perpendicular to the inner side surface 98 and is formed continuous therewith, and an inner side surface 99S, which is substantially perpendicular to the upper surface 99A and is formed continuously therewith. Between the inner side surface 99S of the step part 99 and an outer side surface 42S of the first circumferential wall part 42, a gap B is formed extending along the outer side surface 42S. In the present embodiment, the gap B is set to approximately 1.0 mm. Thus, a second space 33 in the gap B is formed on the outer side of the first circumferential wall part 42 on the rear surface Pb side of the substrate P held by the first holding part PH1.

In addition, the annular first circumferential wall part 42 of the first holding part PH1 is formed so that its outer diameter is smaller than that of the substrate P. In other words, the first circumferential wall part 42 is provided so that it is on the inner side of the edge part of the substrate P (the center part side of the substrate P). Furthermore, the edge area of the substrate P hangs over the outer side of the first circumferential wall part 42 by a prescribed amount (refer to FIG. 5). In the explanation below, the area of the substrate P that hangs over the outer side of the first circumferential wall part 42 is appropriately called an "overhanging part H1." In the present embodiment, the overhanging part H1 is approximately 1.5 mm.

In addition, the step part 99 is provided so that it protrudes from the inner side surface 98 of the recessed part 96 toward the first circumferential wall part 42 side, and the inner diameter of the inner side surface 99S of the step part 99 is smaller than the outer diameter of the substrate P. Furthermore, the upper surface 99A of the step part 99 is formed so that it is slightly lower than the upper surface 42A of the first circumferential wall part 42. Consequently, one part of the overhanging part H1 of the substrate P held by the first holding part PH1 (the outer circumferential edge of the rear surface Pb of the substrate P) and the inner side edge of the upper surface 99A of the step part 99 oppose one another across a prescribed gap G. In the present embodiment, the gap G is set to 1-10 μm. The gap G provides a conduit in fluid communication between the second space 33, which is between the first circumferential wall part 42 and the step part 99, and a space that is between the inner side surface 98 and the side surface Pc of the substrate P held by the first holding part PH1.

In addition, a notched part NT, which is a notch for alignment, is formed in the substrate P in the present embodiment, as shown in FIG. 4. The shape of the inner side surface 98 (inner side edge of the upper surface 97) is set in accordance with the external form of the substrate P (shape of the notched part NT) so that a gap between the side surface Pc of the substrate P in the notched part NT and the inner side surface 98 (upper surface 97) of the substrate holder PH is similarly set to substantially the same size as the gap A discussed above. Specifically, a protruding part 98N that protrudes toward the first circumferential wall part 42 is provided to the inner side surface 98 (inner side edge of the upper surface 97) so that it corresponds to the shape of the notched part NT of the substrate P. In addition, a recessed part 42N that corresponds to the shape of the notched part NT formed in the substrate P is provided in the first circumferential wall part 42 (upper surface 42A). In addition, a protruding part 99N that corresponds to the shape of the notched part NT formed in the substrate P is provided in the step part 99 (upper surface 99A). The recessed part 42N of the first circumferential wall part 42 is provided at a position that opposes the protruding part 99N of the step part 99, and a gap that is substantially the same size of the gap B discussed above is formed between the recessed part 42N and the protruding part 99N. Thereby, the gap A of 0.1-1.0 mm is secured between the inner side surface 98 (upper surface 97) and the entire edge area of the substrate P, including the notched part NT, and the gap B of approximately 1.0 min is secured between the outer side surface 42S of the first circumferential wall part 42 and the inner side surface 99S of the step part 99.

Furthermore, the above explained an example of using the notched part NT as the notch of the substrate P; however, in cases such as when there is no notch or when an orientation flat part is formed in the substrate P as the notch, the prescribed gap A between the substrate P and the inner side surface 98 (upper surface 97) that surrounds such, as well as the prescribed gap B between the outer side surface 42S of the first circumferential wall part 42 and the inner side surface 99S of the step part 99 that surrounds such, may be secured by shaping the first circumferential wall part 42, the step part 99, and the inner side surface 98 in accordance with the external form of the substrate P. Furthermore, if the notch of the substrate P, i.e., the notched part NT, is extremely small, then a recessed part and/or a protruding part that is in accordance with the notch need not be provided to the first circumferential wall part 42, the step part 99, and the inner side surface 98.

The substrate holder PH comprises first recovery ports 51, which are provided between the outer side surface 42S of the first circumferential wall part 42 and the inner side surface 99S of the step part 99. The first recovery ports 51 are capable of recovering the liquid LQ, and are provided to an upper surface 54 of the base PHB between the inner side surface 99S of the step part 99 and the outer side surface 42S of the first circumferential wall part 42.

As shown in FIG. 5 and other figures, each first recovery port 51 is provided at a position that opposes the overhanging part H1 of the rear surface Pb of the substrate P held by the first holding part PH1. Namely, the first recovery ports 51 are provided in the upper surface 54 of the base PHB on the inner side of the edge part of the substrate P held by the first holding part PH1 (the center part side of the substrate P).

In addition, as shown in FIG. 3 and other figures, the first recovery ports 51 are on the outer side of the first circumferential wall part 42 and are provided at a plurality of prescribed positions therealong. In the present embodiment, the first recovery ports 51 are each substantially circular in a plan view, and are provided at prescribed intervals at seven locations in the upper surface 54 of the base PHB along the circumferential direction of the first circumferential wall part 42. In addition, one first recovery port 51 is also provided on the inner side of the recessed part 42N of the first circumferential wall part 42, which is formed in accordance with the notched part NT of the substrate P.

As shown in FIG. 2 and FIG. 5, a suction apparatus 50, which includes a vacuum system, is connected to the first recovery ports 51 through a passageway 52. The suction apparatus 50, which is connected to the first recovery ports 51, and the first vacuum system 40 that negatively pressurizes the first space 31 are independent of one another. The control apparatus CONT is capable of controlling the operation of the suction apparatus 50 and the first vacuum system 40 separately, and therefore the suction operations of the suction apparatus 50 and the first vacuum system 40 can be performed independently.

The front surface Pa, which is the exposure surface of the substrate P, is coated with a photoresist (photosensitive material). In the present embodiment, photosensitive material is a material that is photosensitive to ArF excimer laser light, and is liquid repellent with respect to the liquid LQ. In addition, there are cases wherein the upper layer of the photosensitive material, which is coated on the front surface Pa that is the exposure surface of the substrate P, is coated with, for example, a protective layer (a film that protects the photosensitive material from the liquid) called a topcoat layer, and a liquid repellent material, such as a fluororesin material, may be used as the material that forms this topcoat layer.

In addition, at least one part of the substrate holder PH is given liquid repellency treatment, and the substrate holder PH is liquid repellent with respect to the liquid LQ. In the present embodiment, of the base PHB of the substrate holder PH, the upper surface 42A and the outer side surface 42S of the first circumferential wall part 42 of the first holding part PH1 and the upper surface 46A of each first support part 46 are liquid repellent. In addition, the upper surface 97 and the inner side surface 98 are also liquid repellent. In addition, the upper surface 99A of the step part 99 and the inner side surface 99S are also liquid repellent. One process of giving the substrate holder PH liquid repellency treatment is to coat such with a liquid repellent material such as a fluororesin material or an acrylic resin material.

Figure 6:
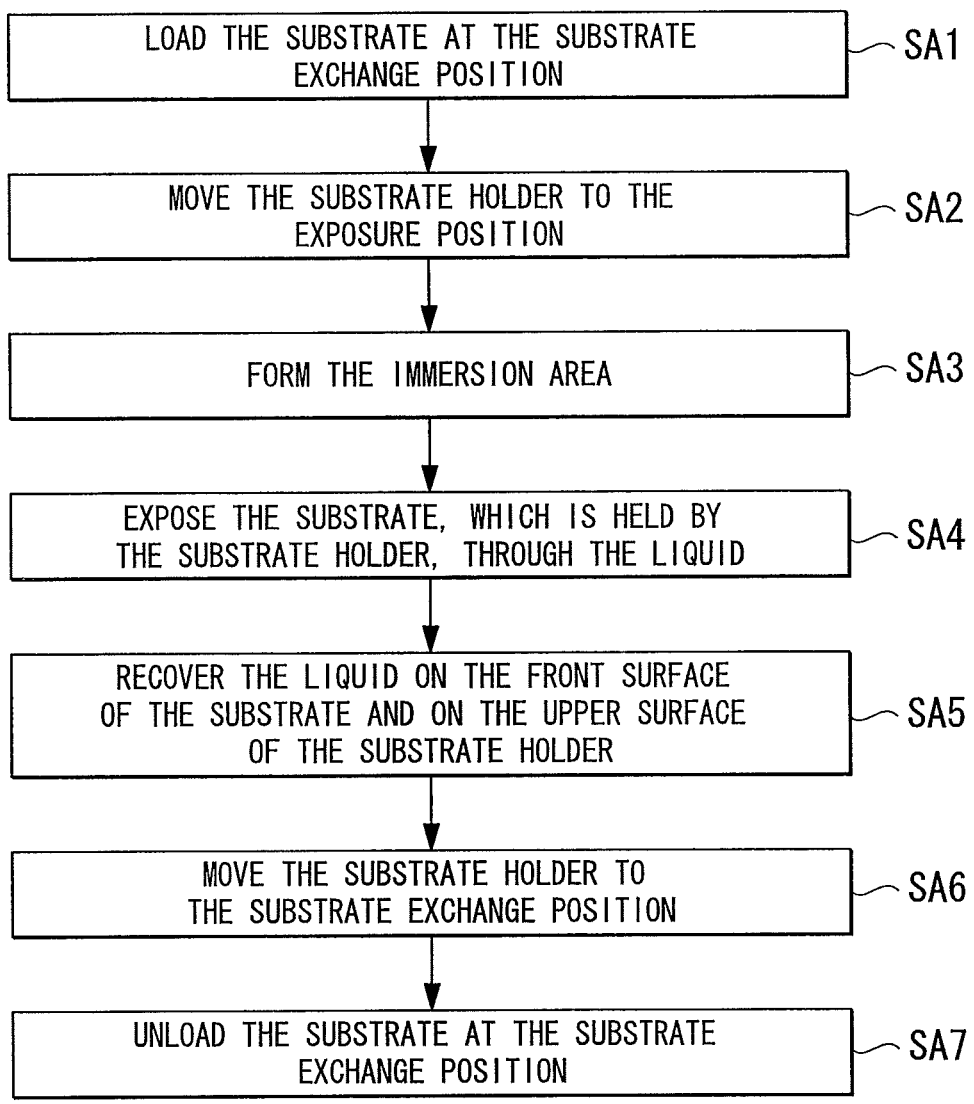
FIG. 6 is a flow chart diagram that depicts one example of an exposure operation.
Figure 7:
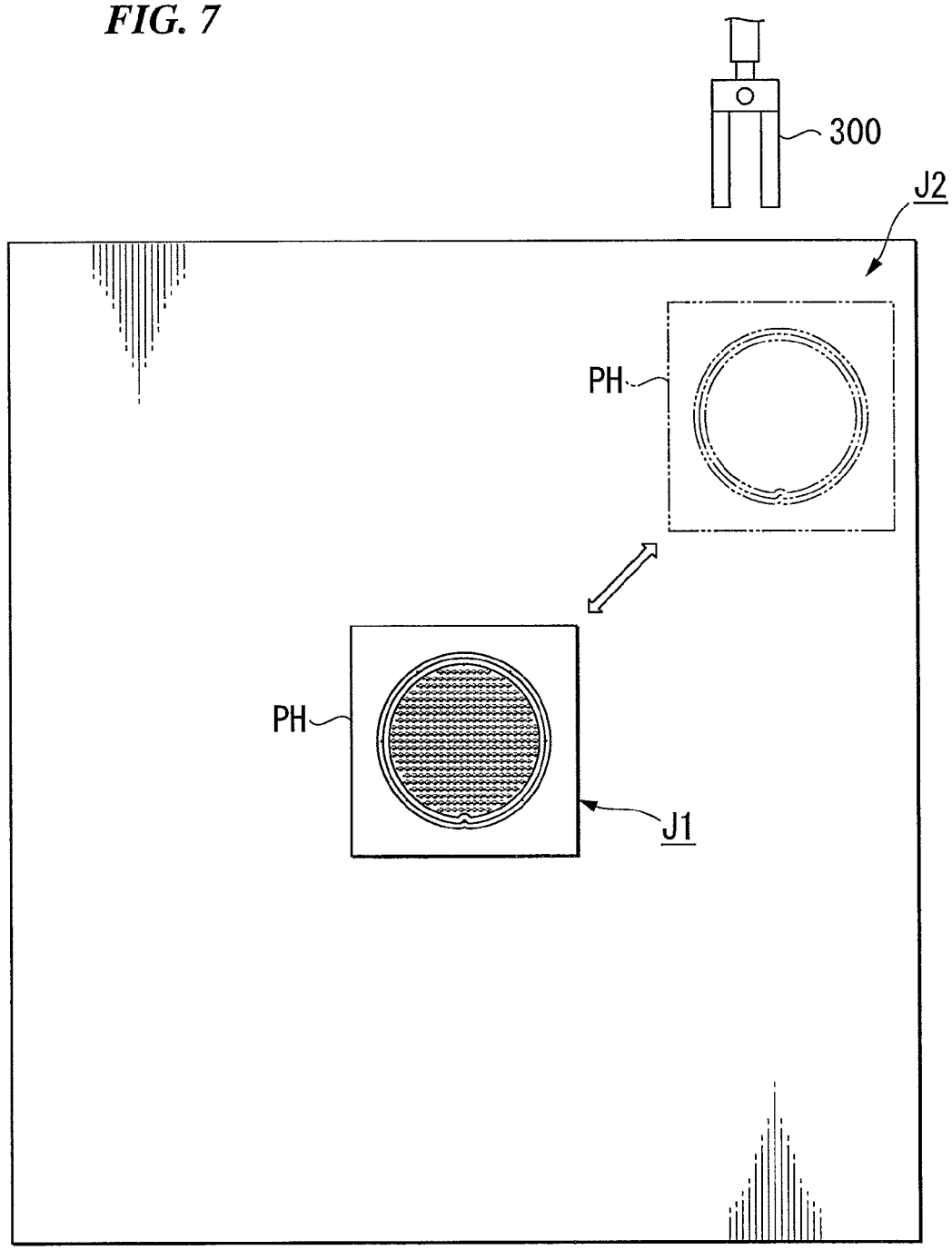
FIG. 7 is a diagrammatic view for explaining the substrate holder, which moves between an exposure process position and a substrate exchange position.

The following explains one example of the operation of the exposure apparatus EX, referencing the flow chart diagram in FIG. 6 and the schematic drawing in FIG. 7.

First, a transport system 300 loads the substrate P that is to undergo the exposure process onto the substrate holder PH at a substrate exchange position J2, which is shown in FIG. 7 (step SA1). Here, the substrate exchange position J2 is a position in the vicinity of the transport system 300 at which the transport system 300 can load and unload the substrate P onto and from the substrate holder PH. When loading the substrate P onto the substrate holder PH, the control apparatus CONT uses the substrate stage drive apparatus PSTD to move the substrate stage PST, which is supported by the substrate holder PH, to the substrate exchange position J2, whereupon the substrate P transitions to a state wherein it can be loaded by the transport system 300.

After the substrate P is loaded onto the substrate holder PH, the control apparatus CONT negatively pressurizes the first space 31 and uses the first holding part PH1 of the substrate holder PH to hold the loaded substrate P. At this time, the rear surface Pb of the substrate P supported by the first support parts 46 and the upper surface 42A of the first circumferential wall part 42 contact one another (form a tight seal). The control apparatus CONT uses the substrate stage drive apparatus PSTD to move the substrate stage PST, which is supported by the substrate holder PH, to an exposure process position J1 at which the exposure is performed (step SA2). Here, the exposure process position J1 is a position that is directly below the projection optical system PL. In a state wherein the projection optical system PL and the substrate P (substrate holder PH) are opposed to one another, the control apparatus CONT uses the liquid immersion mechanism 100 to start the operations of supplying and recovering the liquid LQ, and forms the liquid immersion region LR of the liquid LQ on the image plane side of the projection optical system PL (step SA3). The control apparatus CONT fills the optical path space K1 between the projection optical system PL and the substrate P with the liquid LQ by forming the liquid immersion region LR, and then emits the exposure light EL from the illumination optical system IL and radiates such through the projection optical system PL and the liquid LQ onto the substrate P held by the substrate holder PH, thereby performing an immersion exposure of the substrate P (step SA4).

The exposure apparatus EX of the present embodiment is a scanning type exposure apparatus (a so-called scanning stepper) that projects the image of the pattern formed on the mask M onto the substrate P while moving the mask M and the substrate P in the X axial directions (scanning directions). During scanning exposure, the pattern image of one part of the mask M is projected onto the projection area AR through the liquid LQ of the liquid immersion region LR and the projection optical system PL, and the substrate P moves at a velocity of $\beta \cdot V$ (where $\beta$ is the projection magnification) in the $+X$ direction (or the $-X$ direction) with respect to the projection area AR, synchronized to the movement of the mask M at a velocity V in the $-X$ direction (or the $+X$ direction). A plurality of shot regions are set up on the substrate P; after the exposure of one shot region is complete, the next shot region moves to the scanning start position by the stepping movement of the substrate P; subsequently, by using the step-and-scan method, the substrate P is moved and the scanning exposure process is performed successively for each shot region.

After the immersion exposure process of the substrate P is complete, the control apparatus CONT stops the liquid supply operation of the liquid supply mechanism 10. Furthermore, in a state wherein the substrate P is held by the substrate holder PH, the control apparatus CONT uses the liquid recovery mechanism 20 to recover the liquid LQ that remains on the front surface Pa of the substrate P and the upper surface 97 of the substrate holder PH (step SA5). After recovering the liquid LQ that remains on the front surface Pa of the substrate P and the upper surface 97 of the substrate holder PH, the control apparatus CONT uses the substrate stage drive apparatus PSTD to move the substrate stage PST supported by the substrate holder PH to the substrate exchange position J2 (step SA6). Furthermore, the transport system 300 unloads the substrate P after it has undergone the exposure process from the substrate holder PH at the substrate exchange position J2 (step SA7).

Thus, the substrate stage drive apparatus PSTD is capable of moving the substrate holder PH (substrate stage PST) between the exposure process position J1, which is the position at which the substrate P is exposed, and the substrate exchange position J2, which is separate from the exposure process position J1.

The following explains the liquid recovery operation of the substrate holder PH.

As shown in FIG. 5, one part of the immersion region LR, which is formed on the image plane side of the projection optical system PL, is formed on the outer side of the substrate P when performing an immersion exposure of an edge area Eg of the front surface Pa of the substrate P in step SA4 discussed above. Namely, the immersion region LR is formed on the substrate P and the upper surface 97. In this state, the immersion region LR of the liquid LQ is formed above the gap A. In this case, because the gap A between the upper surface 97 (inner side surface 98) and the substrate P held by the first holding part PH1 is set to 0.1-1.0 mm, the surface tension of the liquid LQ suppresses the infiltration of the liquid LQ into the gap A.

In addition, making the inner side surface 98 and the upper surface 97 of the substrate holder PH liquid repellent suppresses the infiltration of the liquid LQ into the second space 33 through the gap A. Accordingly, even when exposing the edge area Eg of the substrate P, it is possible to hold the liquid LQ below the projection optical system PL by the upper surface 97.

Thus, although the infiltration of the liquid LQ from the gap A is suppressed by, for example, reducing the size of the gap A and making the inner side surface 98 and the upper surface 97 of the substrate holder PH liquid repellent, there is a possibility that the liquid LQ will infiltrate the recessed part 96 of the substrate holder PH through the gap A formed at the circumference of the substrate P due to, for example, the movement of the substrate holder PH and/or changes in the pressure of the liquid LQ that forms the immersion region LR. If the liquid LQ leaks into the second space 33 through the gap A, it is possible to prevent the infiltration of the liquid LQ to the inner side of the first circumferential wall part 42 because the rear surface Pb of the substrate P and the upper surface 42A of the first circumferential wall part 42 are substantially tightly sealed; however, as shown in FIG. 5, there is a strong possibility that the liquid LQ that infiltrates the second space 33 will adhere to an area of the rear surface Pb of the substrate P on the outer side of the first circumferential wall part 42, i.e., to the overhanging part H1 of the rear surface Pb of the substrate P. Alternatively, there is a strong possibility that the liquid LQ that passes through the gap A will adhere to, for example, the outer side surface 42S of the first circumferential wall part 42, the inner side surface 98, the upper surface 99A and the inner side surface 99S of the step part 99, or the upper surface 54 of the base PHB.

Figure 8:
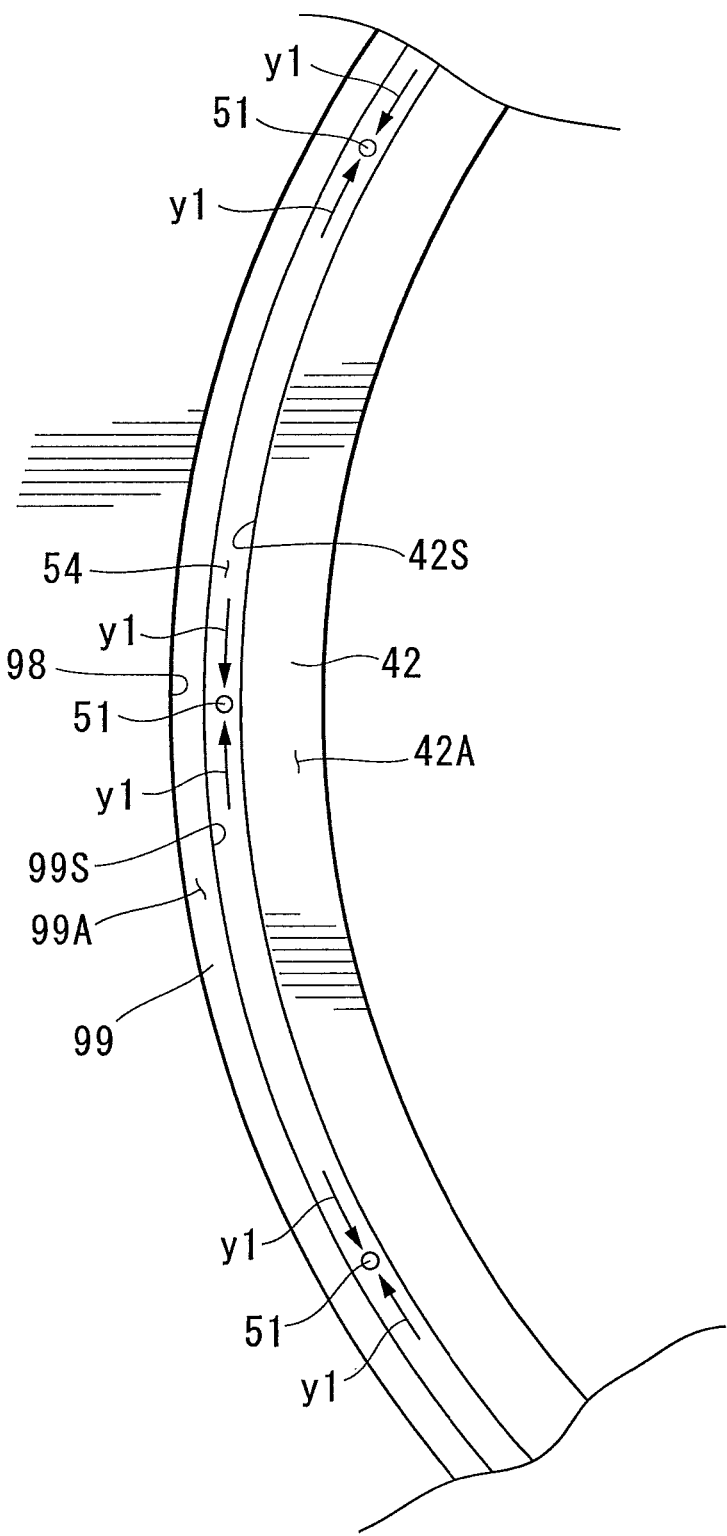
FIG. 8 is a diagrammatic view for explaining the flows of gas.

In the present embodiment, the liquid LQ that infiltrates the second space 33 through the gap A can be recovered by driving the suction apparatus 50. As shown by the schematic diagram in FIG. 8, when the suction apparatus 50 is driven, the gas surrounding the first recovery ports 51 (i.e., the gas in the second space 33) is suctioned by the first recovery ports 51. Namely, the suctioning of the gas out of the second space 33 through the first recovery ports 51 by the suction apparatus 50 generates flows of gas that move toward the inner side of the substrate P in the micro gap G between the step part 99 and the overhanging part H1 of the rear surface Pb of the substrate P, and also generates flows of gas that move toward the first recovery ports 51 in the micro gap between the inner side surface 99S of the step part 99 and the outer side surface 42S of the first circumferential wall part 42 (refer to arrows y1 in FIG. 8). Namely, flows of gas that are guided by the first circumferential wall part 42 are generated in the second space 33. In other words, flows of gas that move toward the first recovery ports 51 are generated along the first circumferential wall part 42 in the grooved second space 33 of the gap B.

The flows of gas along the first circumferential wall part 42 generated by the suction apparatus 50 move the liquid LQ, which infiltrated the second space 33 through the gap A, to the first recovery ports 51. Specifically, the flows of gas along the first circumferential wall part 42 move the liquid LQ that infiltrates the second space 33 through the gap A, e.g., the liquid LQ that adheres to the overhanging part H1 of the rear surface Pb of the substrate P, as well as the liquid LQ that adheres to the outer side surface 42S of the first circumferential wall part 42 and the like, to the first recovery ports 51. Furthermore, the liquid LQ that moves to the first recovery ports 51 is recovered therethrough. Thus, forming the second space 33, which has the gap B of approximately 1 mm, at the circumference of the first circumferential wall part 42 and providing a plurality of the first recovery ports 51 at prescribed spacings along the circumference of the first circumferential wall part 42 makes it possible for the drive of the suction apparatus 50 to generate high speed flows of gas along the first circumferential wall part 42 that move the liquid LQ, which infiltrated the gap A and adhered to the outer side surface 42S of the first circumferential wall part 42, the inner side surface 99S of the step part 99, and the like, to the first recovery ports 51, and thereby the liquid LQ is recovered. In addition, because the step part 99 is provided inside the recessed part 96 and the micro gap G is provided between the overhanging part H1 of the rear surface Pb of the substrate P and the upper surface 99A of the step part 99, the drive of the suction apparatus 50 generates high speed flows of gas in the gap G that move toward the second space 33, and these flows of gas rapidly move the liquid LQ adhered between, for example, the substrate P and the inner side surface 98 as well as the substrate P and the step part 99 to the second space 33, thereby making it possible to recover the liquid LQ via the first recovery ports 51.

Furthermore, because the second space 33 is open to the atmosphere via the gap A, the desired flows of gas can be smoothly generated even if the gas of the second space 33 is suctioned through the first recovery ports 51 because the gas flows from the exterior to the interior of the second space 33 through the gap A.

Figure 9:
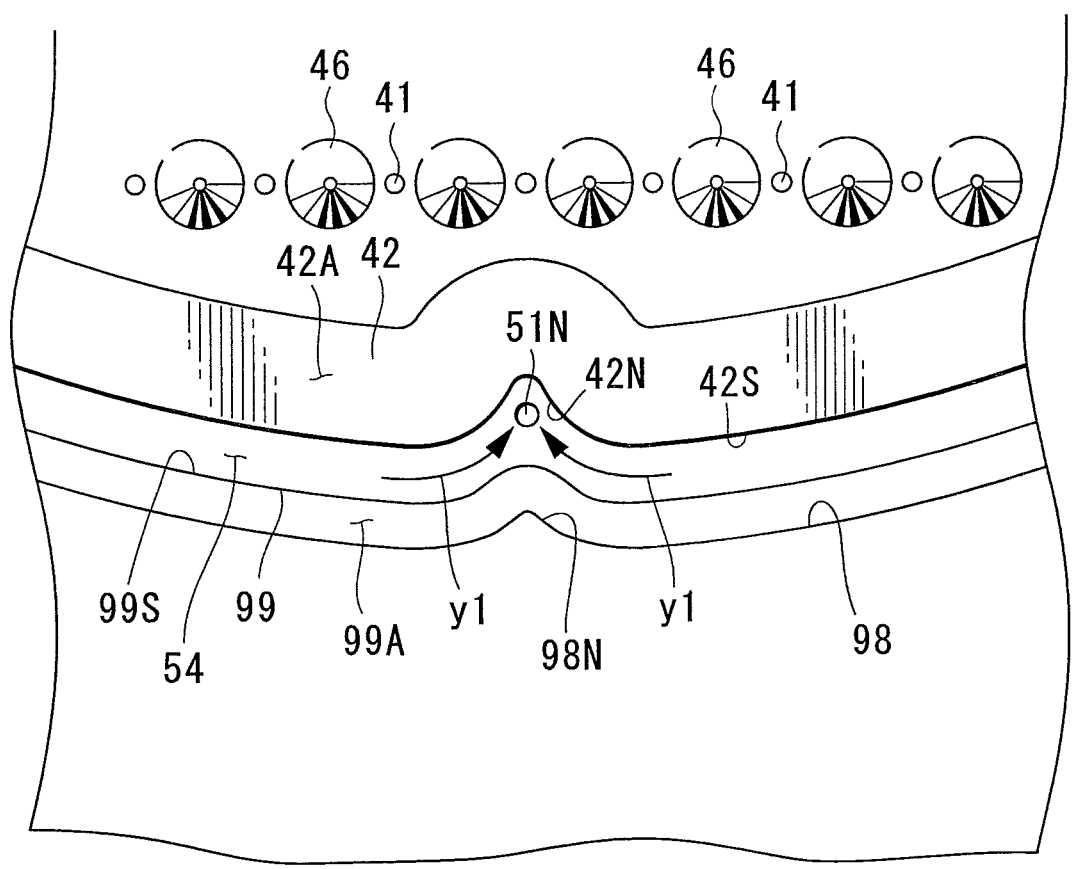
FIG. 9 is a diagrammatic view for explaining the flows of gas.

In addition, as shown by the enlarged view in FIG. 9, a first recovery port 51N is also provided on the inner side of the recessed part 42N, which is formed in one part of the outer side surface 42S of the first circumferential wall part 42; consequently, the flow of gas toward the recessed part 42N of the first circumferential wall part 42 moves the liquid LQ that infiltrated the vicinity of the recessed part 42N through the gap A to the first recovery port 51N and the liquid LQ is recovered therethrough.

Furthermore, although not shown, the flow of the liquid LQ into the suction apparatus 50 is prevented by the provision of a gas-liquid separator, which separates the gas from the liquid LQ recovered by the first recovery ports 51, along the passageway 52 between the first recovery ports 51 and the suction apparatus 50, which includes a vacuum system.

In addition, in the present embodiment, the operation of recovering the liquid LQ using the first recovery ports 51 is performed after the exposure of the substrate P through the liquid LQ is complete, i.e., after the process in step SA4 discussed above is complete. Namely, in the present embodiment, the suction apparatus 50 is stopped and the operation of recovering the liquid LQ using the first recovery ports 51 is stopped during the exposure of the substrate P through the liquid LQ. Stopping the recovery operation that uses the first recovery ports 51 during exposure makes it possible to suppress, for example, vibrations and degradation in the degree of flatness of the front surface Pa of the substrate P that are caused by that the operation of recovering the liquid LQ using the first recovery ports 51. Furthermore, performing the recovery operation using the first recovery ports 51 after the exposure through the liquid LQ is complete (after step SA4) and in a state wherein the substrate P is held by the substrate holder PH makes it possible to smoothly recover the liquid LQ using the first recovery ports 51.

In addition, the operation of recovering the liquid LQ using the first recovery ports 51 is performed after the exposure of the substrate P is complete (after step SA4), and may be performed anytime thereafter as long as it is performed before the substrate holder PH unloads the substrate P. For example, after the exposure of the substrate P is complete, the operation of recovering the liquid LQ on the substrate holder PH and on the substrate P using the liquid recovery mechanism 20 (i.e., the operation of step SA5), and the operation of recovering the liquid LQ using the first recovery ports 51 may be performed in parallel. In this case, the operation of recovering the liquid LQ using the first recovery ports 51 is performed at the exposure process position J1.

Alternatively, after the exposure of the substrate P is complete, the operation of recovering the liquid LQ using the first recovery ports 51 may be performed while the substrate holder PH (substrate stage PST) is moved from the exposure process position J1 to the substrate exchange position J2. Namely, after the exposure of the substrate P is complete, the operation of moving the substrate holder PH and the operation of recovering the liquid LQ using the first recovery ports 51 may be performed in parallel. Because the operation of recovering the liquid LQ using the first recovery ports 51 is performed while moving the substrate holder PH (substrate stage PST) from the exposure process position J1 to the substrate exchange position J2, the unloading of the substrate P, for which the exposure process is finished, can be started immediately after the substrate holder PH is moved to the substrate exchange position J2.

Alternatively, after the exposure of the substrate P is complete and the substrate holder PH (substrate stage PST) has moved to the substrate exchange position J2, the operation of recovering the liquid LQ using the first recovery ports 51 may be performed at the substrate exchange position J2 before the substrate holder PH unloads the substrate P.

As explained above, because the liquid LQ in the second space 33 on the outer side of the first circumferential wall part 42 is recovered through the first recovery ports 51, even if the liquid LQ infiltrates the second space 33 through the gap A, it is possible to prevent problems such as the liquid LQ infiltrating the first space 31 through a space between the rear surface Pb of the substrate P and the upper surface 42A of the first circumferential wall part 42, or leaving the liquid LQ in a state wherein it is adhered to the rear surface Pb (overhanging part H1) of the substrate P. Accordingly, it is possible to prevent the occurrence of problems such as the breakdown of the first vacuum system 40 due to the flow of the liquid LQ that infiltrated the first space 31 into the first vacuum system 40 through the first suction ports 41. In addition, recovering the liquid LQ using the first recovery ports 51 also makes it possible to prevent the occurrence of problems such as: the degradation of the flatness of the substrate P caused by the infiltration of the liquid LQ between an upper surface of the first support parts 46 and the rear surface Pb of the substrate P; the inability to satisfactorily hold the substrate P; rusting of the substrate holder PH caused by leaving the substrate holder PH in a wet state; and thermal deformation of the substrate holder PH due to the heat of vaporization when the liquid LQ vaporizes. In addition, because the liquid LQ is recovered using the first recovery ports 51, the substrate P is transported by the transport system 300 without any liquid LQ adhered to the rear surface Pb of the substrate P, and it is therefore possible to also prevent increased damage such as the adherence of the liquid LQ to the transport system 300 or the dispersion of the liquid LQ in the transport pathway.

In particular, using the first recovery ports 51 to recover the liquid LQ that is adhered to the overhanging part H1 of the rear surface Pb of the substrate P held by the first holding part PH1 that is on the outer side of the first circumferential wall part 42 makes it possible to prevent problems such as wetting of the transport system 300 when unloading the substrate P, as well as the attachment of the upper surface 42A of the first circumferential wall part 42 of the substrate holder PH to the rear surface Pb of the substrate P due to the effect of the surface tension of the liquid LQ that infiltrated to the rear surface Pb side of the substrate P, thereby making it impossible to smoothly perform the work of exchanging the substrate P.

In addition, forming the micro gap B and the gap G on the rear surface Pb side of the substrate P and the operation of suctioning through the first recovery ports 51 via the suction apparatus 50 generate high speed flows of gas that move toward the first recovery ports 51, which consequently makes it possible to recover the liquid LQ that infiltrates from the gap A with a simple configuration.

Furthermore, the size of the overhanging part H1 can be appropriately set while taking into consideration, for example, the dimensional tolerance of the substrate P and the accuracy with which the transport system 300 mounts the substrate P to the substrate holder PH so that the desired flows of gas can be generated and so that the amount of flexure of the substrate P at the edge part can be kept below a permissible value. In addition, it is preferable to set the gap B of the second space 33 to 0.5-1.5 mm in order to generate high speed flows of gas.

In addition, because the liquid LQ in the gap B on the outer side of the first circumferential wall part 42 is moved to the first recovery ports 51 by the flows of gas toward the first circumferential wall part 42, even if, for example, the liquid LQ adheres to a corner part, an angle part, or the like (refer to symbol K in FIG. 5) of the second space 33 formed by the upper surface 54 of the base PHB, the outer side surface 42S of the first circumferential wall part 42, and the inner side surface 99S of the step part 99, the flows of the gas can smoothly move the liquid LQ of that corner part K to the first recovery ports 51, and thereby the liquid LQ is recovered. Particularly in the present embodiment, providing the first recovery ports 51 at a plurality of positions at prescribed intervals in the vicinity of the first circumferential wall part 42 in the upper surface 54 of the base PHB makes it possible to satisfactorily generate flows of gas that move along the corner part K and to smoothly recover the liquid LQ that pools in the corner part K.

In addition, providing the first recovery port 51N so that it is also on the inner side of the recessed part 42N makes it possible to prevent the liquid LQ from pooling thereon.

Figure 10:
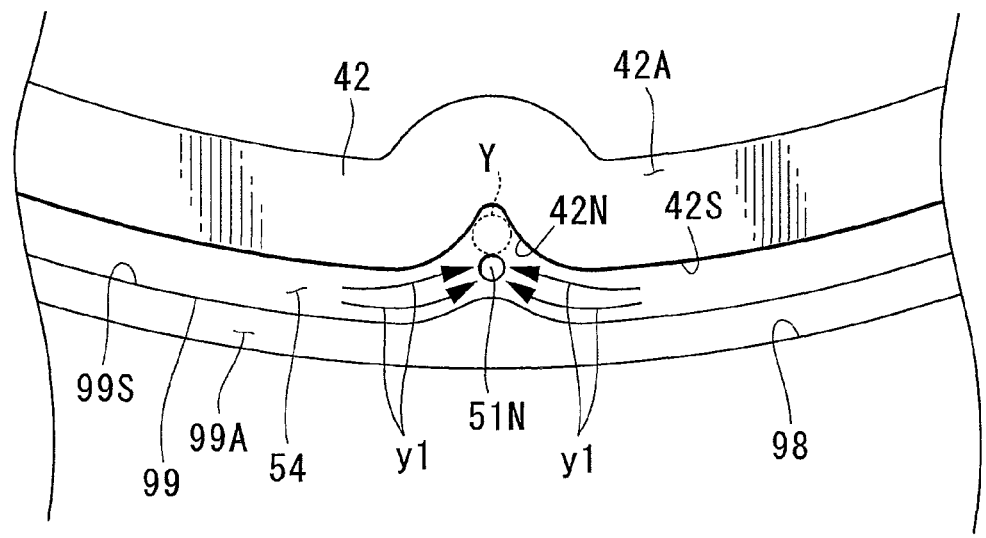
FIG. 10 is a diagrammatic view for explaining the flows of gas.

Furthermore, as shown in FIG. 10, if the first recovery port 51N is provided on the outer side of the recessed part 42N (even if it is in the vicinity of the recessed part 42N), then there is a strong possibility that an area (stagnant area) Y will be formed wherein a flow of gas is not generated on the inner side of the recessed part 42N, even if the gas is suctioned through the first recovery port 51N by the suction apparatus 50, which will consequently lead to a problem wherein the liquid LQ that pools on the inner side of the recessed part 42N scarcely move to the first recovery port 51N. In the present embodiment, the provision of the first recovery port 51N on the inner side of the recessed part 42N makes it possible to smoothly recover even the liquid LQ that pools in the recessed part 42N.

Figure 11:
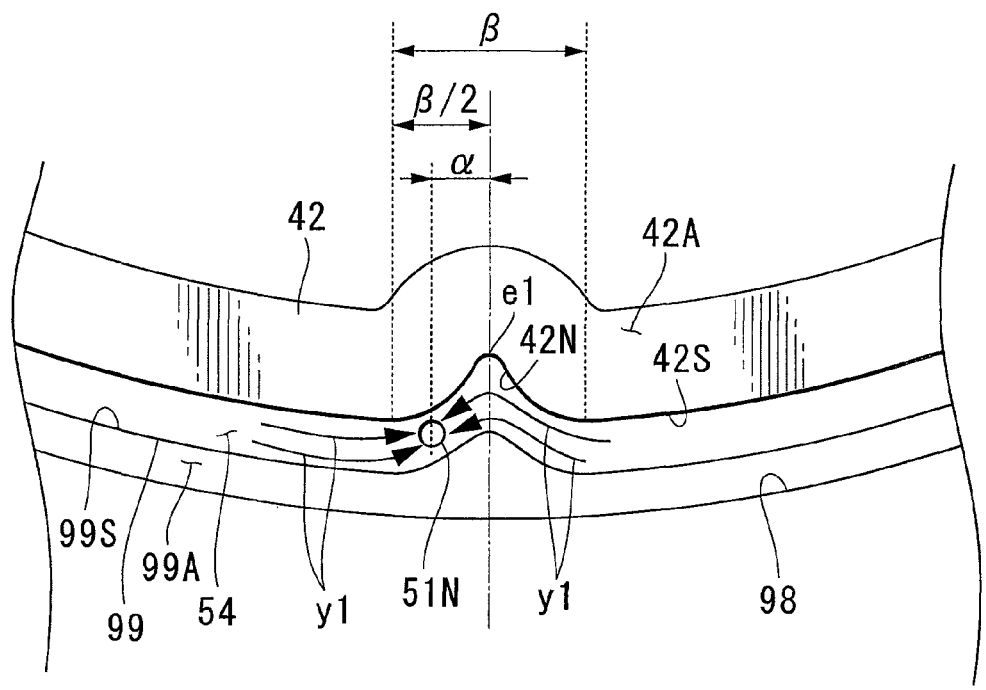
FIG. 11 is a diagrammatic view for explaining the flows of gas.

In addition, if it is difficult to provide the first recovery port 51N on the inner side of the recessed part 42N due to, for example, design considerations, then the first recovery port 51N may be provided at a position that is shifted from a center position e1 of the recessed part 42N by a prescribed distance α in the circumferential direction of the first circumferential wall part 42, as shown in FIG. 11. In so doing, a flow of gas can be generated on the inner side of the recessed part 42N even if the first recovery port 51N is provided on the outer side of the recessed part 42N, which makes it possible to move the liquid LQ that pools on the inner side of the recessed part 42N to the first recovery port 51N, and thereby the liquid LQ is recovered. Furthermore, if the width of the recessed part 42N is assigned to β, then the distance α preferably satisfies the condition of α≤β/2. In so doing, it is possible to generate a flow of gas on the inner side of the recessed part 42N.

Second Embodiment

The following explains the second embodiment. The characteristic feature of the present embodiment is the provision of a second circumferential wall part 44, which guides the flows of gas toward the first recovery ports 51, on the outer side of the first circumferential wall part 42. In the explanation below, constituent parts that are identical or equivalent to those in the embodiments discussed above are assigned identical symbols, and the explanations thereof are therefore abbreviated or omitted.

Figure 12:
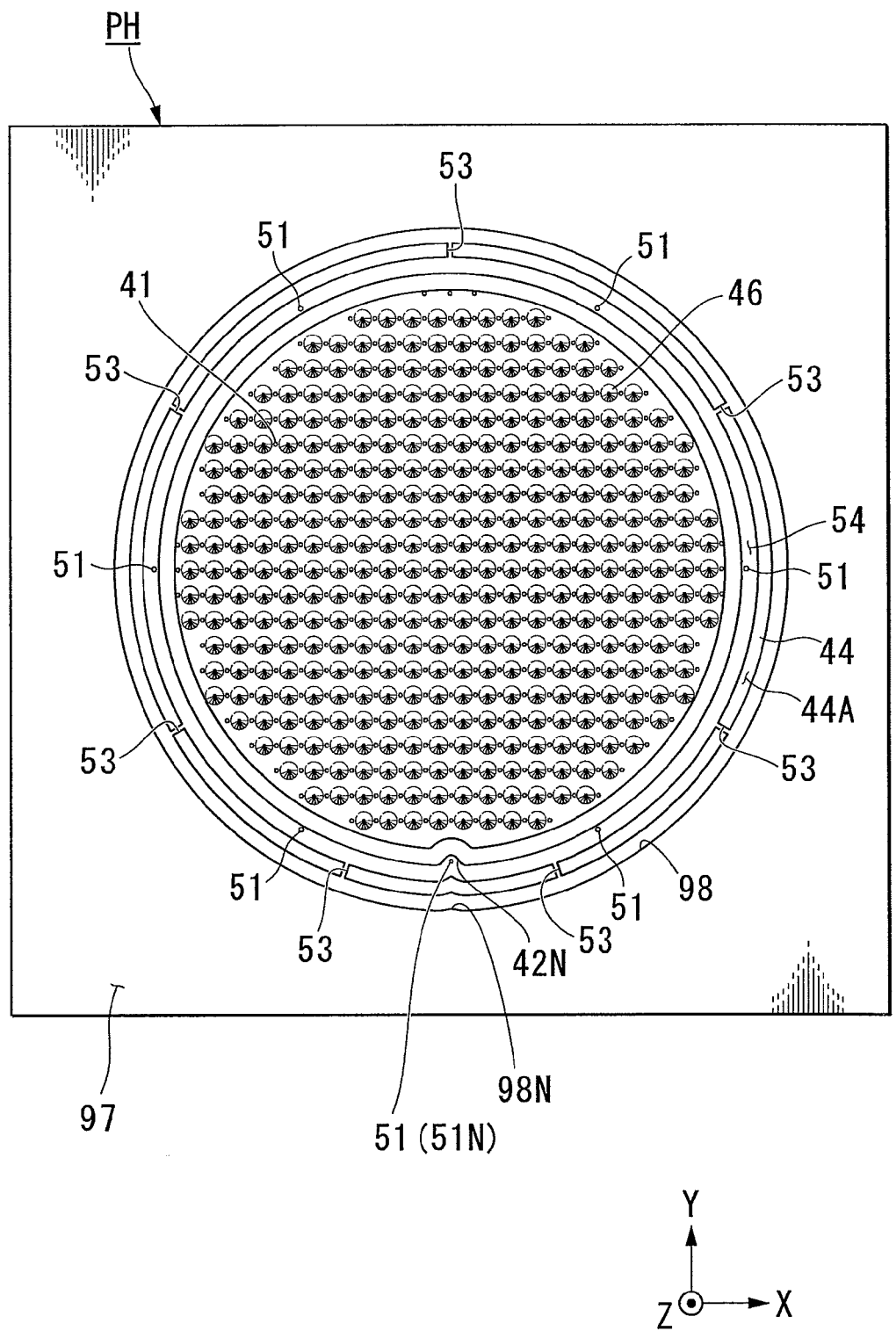
FIG. 12 is a plan view of the substrate holder according to the second embodiment.
Figure 13:
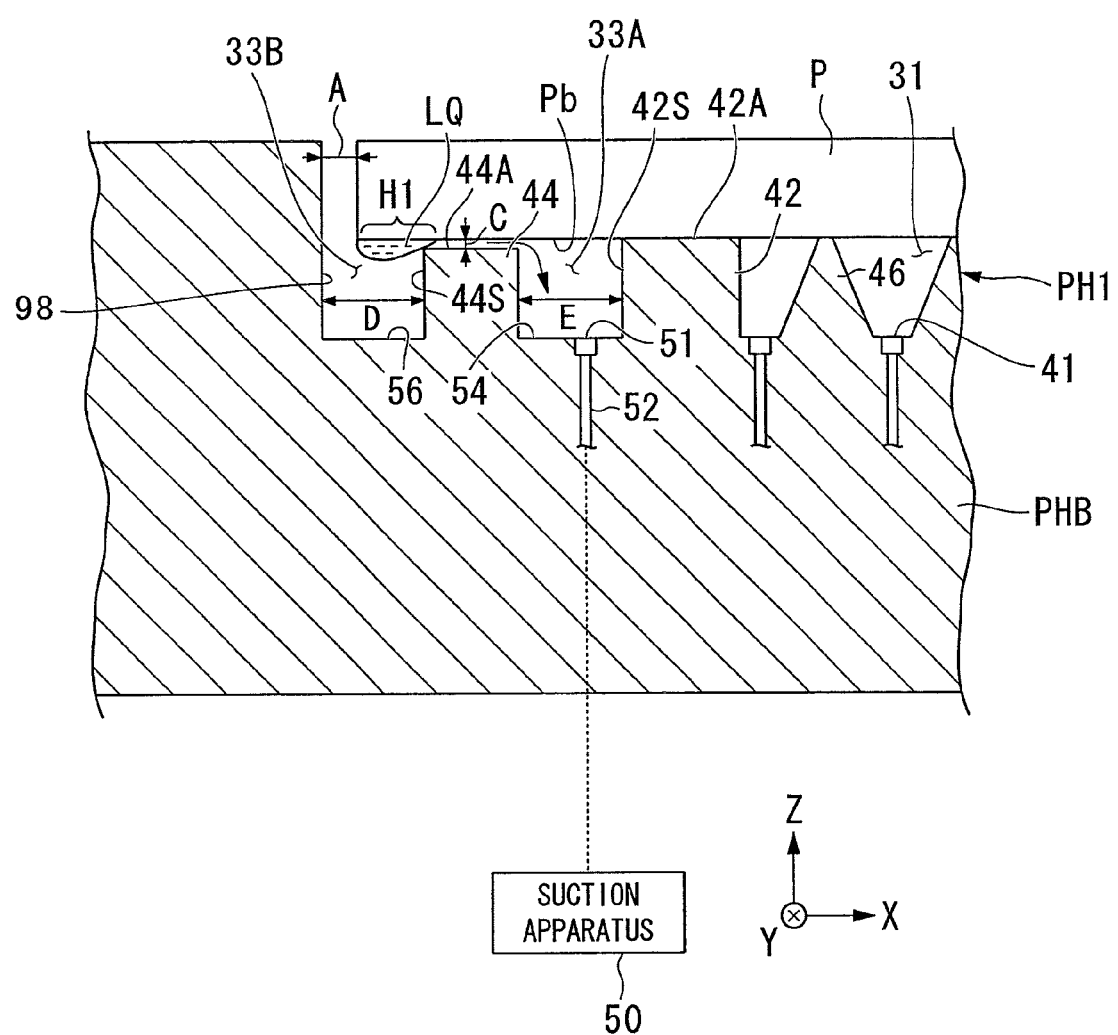
FIG. 13 is an enlarged side cross sectional view of the principal parts of the substrate holder according to the second embodiment.

FIG. 12 is a plan view of the substrate holder PH according to the second embodiment, and FIG. 13 is an enlarged cross sectional view of the principal parts of the substrate holder PH according to the second embodiment. In FIG. 12 and FIG. 13, the substrate holder PH comprises the second circumferential wall part 44, which guides the flows of gas toward the first recovery ports 51, on the outer side of the first circumferential wall part 42. The second circumferential wall part 44 is substantially annular in a plan view, and is provided so that it surrounds the first circumferential wall part 42.

As shown in FIG. 13, the second circumferential wall part 44 is provided so that an upper surface 44A thereof opposes the rear surface Pb of the substrate P held by the first holding part PH1. Furthermore, the upper surface 44A of the second circumferential wall part 44 is formed so that it is slightly lower than the upper surface 42A of the first circumferential wall part 42. Furthermore, when the rear surface Pb of the substrate P and the upper surface 42A of the first circumferential wall part 42 contact one another due to the negative pressurization of the first space 31, a slight gap C is provided between the rear surface Pb of the substrate P and the upper surface 44A of the second circumferential wall part 44. The contact of the upper surface 42A of the first circumferential wall part 42 with the rear surface Pb of the substrate P maintains the gas tightness of the first space 31, which makes it possible for the first holding part PH1 to satisfactorily chuck the substrate P as well as to suppress the infiltration of the liquid LQ into the first space 31.

In addition, in the present embodiment as well, the gap A of 0.1-1.0 mm is formed between an edge part of the substrate P held by the first holding part PH1 and the inner side surface 98 (upper surface 97).

The gap C provides a conduit in fluid communication between a second space 33A, which is between the first circumferential wall part 42 and the second circumferential wall part 44, and a space on the outer side of the second space 33A. Here, the space on the outer side of the second space 33A includes an atmospheric space, which itself includes a third space 33B between the inner side surface 98 and an outer side surface 44S of the second circumferential wall part 44. The second space 33A is surrounded by the first circumferential wall part 42, the second circumferential wall part 44, the upper surface 54 of the base PHB, and the substrate P held by the first holding part PH1, and is open to the atmosphere via the gap C and the gap A.

A prescribed gap D is provided between the outer side surface 44S of the second circumferential wall part 44 and the inner side surface 98. The gap D is larger than the gap A, e.g., approximately 2.5 mm. In addition, the annular second circumferential wall part 44 is formed so that its outer diameter is smaller than that of the substrate P. In other words, the second circumferential wall part 44 is provided on the inner side of the edge part of the substrate P (the medial side of the substrate P). Furthermore, the edge area of the substrate P forms the overhanging part H1 that hangs over the outer side of the second circumferential wall part 44 by a prescribed amount.

As shown in FIG. 12, one part of the second circumferential wall part 44 is provided with slit parts 53 for fluid communication between the second space 33A, which is between the first circumferential wall part 42 and the second circumferential wall part 44, and a space on the outer side of the second space 33A (an atmospheric space that includes the third space 33B). Namely, the second space 33A is open to the atmosphere via the slit parts 53 and the abovementioned gap C and gap A.

Figure 15:
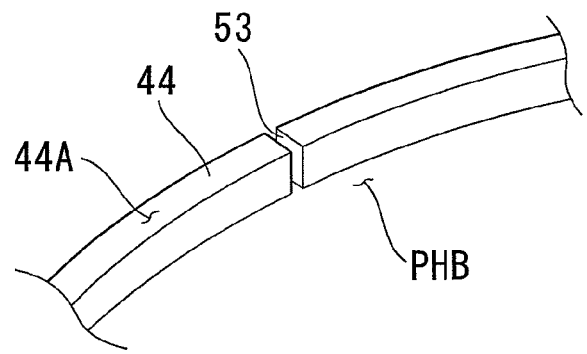
FIG. 15 is a perspective view that shows one example of a slit part.

One slit part 53 is provided at each position of a plurality of prescribed positions in the circumferential direction of the second circumferential wall part 44. In the present embodiment, the slit parts 53 are provided at prescribed intervals at seven locations in the circumferential direction of the second circumferential wall part 44. As shown in FIG. 15, each slit part 53 in the present embodiment is formed so that it extends in the vertical directions (Z axial directions), and a lower end part of each slit part 53 reaches the base PHB of the substrate holder PH. Moreover, an upper end part of each slit part 53 reaches the upper surface 44A of the second circumferential wall part 44. Accordingly, the second circumferential wall part 44 in the present embodiment is formed by the combination of a plurality of arcuate members, each of which is arcuate in a plan view, and the provision of the plurality of those arcuate members along the first circumferential wall part 42 forms an overall shape that is substantially annular.

The plurality of first recovery ports 51 are provided along the first circumferential wall part 42 in the upper surface 54 of the base PHB between the first circumferential wall part 42 and the second circumferential wall part 44. Each first recovery port 51 is provided between adjacent slit parts 53.

In other words, each slit part 53 is provided between adjacent first recovery ports 51.

The following explains the liquid recovery operation of the substrate holder PH according to the second embodiment.

As shown in FIG. 13, there is a strong possibility that the liquid LQ that infiltrates the third space 33B through the gap A will adhere to the area of the rear surface Pb of the substrate P that is on the outer side of the second circumferential wall part 44, i.e., the overhanging part H1 of the rear surface Pb of the substrate P. Furthermore, there is a strong possibility that the liquid LQ that infiltrates from the gap A will infiltrate the second space 33A through the gap C and adhere to, for example, the rear surface Pb of the substrate P and the outer side surface 42S of the first circumferential wall part 42, which form the second space 33A, or to the upper surface 54 of the base PHB between the first circumferential wall part 42 and the second circumferential wall part 44.

Figure 14:
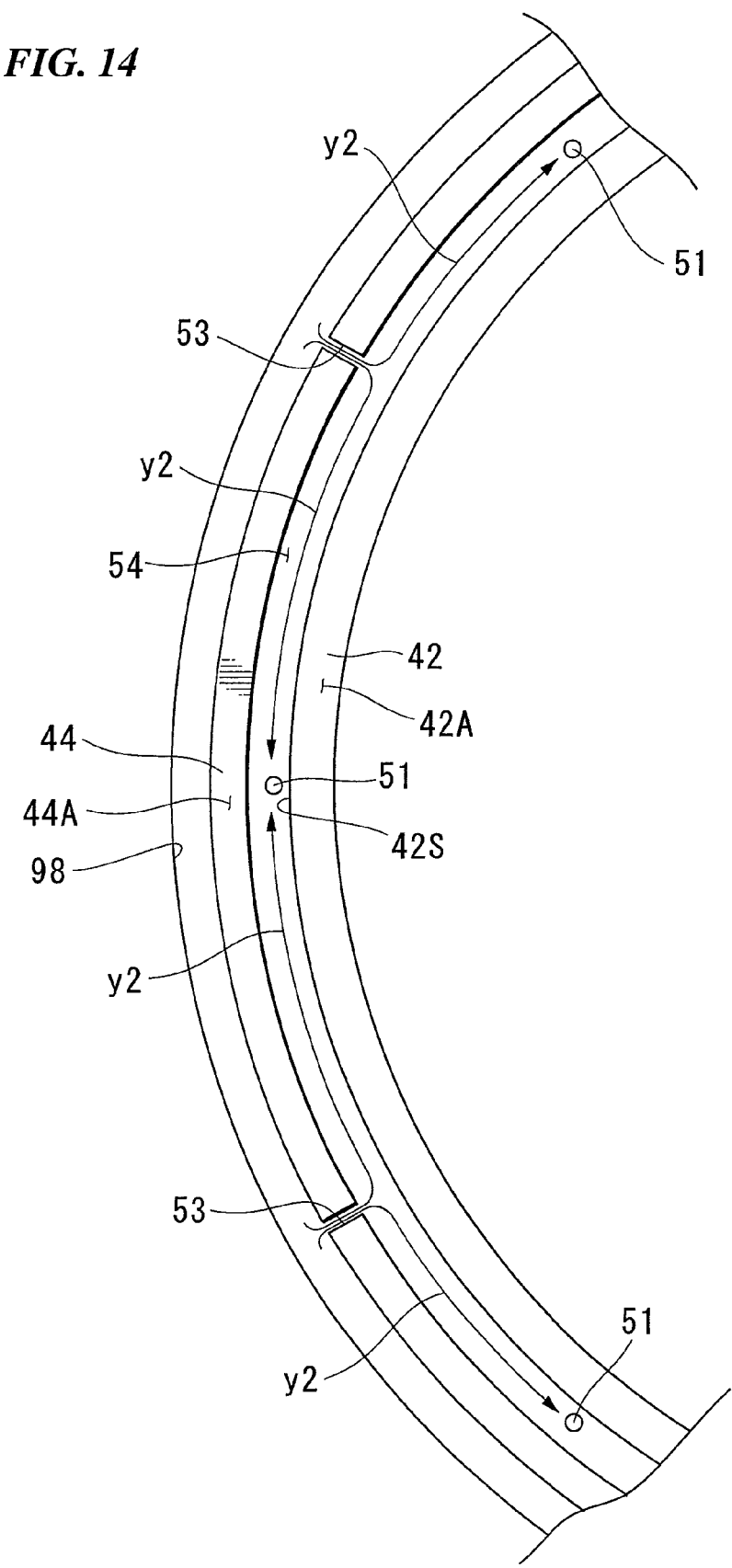
FIG. 14 is a diagrammatic view for explaining the flows of gas.

The liquid LQ that infiltrates the second space 33A through the gap A can be recovered by the drive of the suction apparatus 50. As shown by the schematic drawing in FIG. 14, when the suction apparatus 50 is driven, the gas surrounding the first recovery ports 51 (the gas in the second space 33A) is suctioned thereby. Namely, the suction apparatus 50 suctions the gas out of the second space 33A through the first recovery ports 51, which generates flows of gas that move toward the first recovery ports 51 in the vicinity of the first recovery ports 51 (second space 33A) (refer to arrows y2 in FIG. 14).

Here, the second circumferential wall part 44 is provided with a function that guides the flows of gas toward the first recovery ports 51 on the outer side of the first circumferential wall part 42. Accordingly, the operation of suctioning through the first recovery ports 51 via the suction apparatus 50 makes it possible to satisfactorily generate flows of gas that move toward the first recovery ports 51. In addition, high speed flows of gas can be generated in the second space 33A by providing the second circumferential wall part 44 on the outer side of the first circumferential wall part 42 with a gap E of approximately 1 mm. Accordingly, those flows of gas can smoothly move the liquid LQ on the outer side of the first circumferential wall part 42 (second space 33A) to the first recovery ports 51, and thereby the liquid LQ is recovered. In this case, the liquid LQ that pools on the inner side of the second space 33A, e.g., at the corner part K, can be more reliably recovered. Furthermore, it is preferable to set the gap E between the first circumferential wall part 42 and the second circumferential wall part 44 to 0.5-1.5 mm in order to generate high speed flows of gas.

Furthermore, because the second space 33A is open to the atmosphere via the gap C, the slit parts 53, and the gap A, even if the gas in the second space 33A is suctioned through the first recovery ports 51, the desired flows of gas can be smoothly generated because the gas flows from the exterior to the interior of the second space 33A via the gap C and the slit parts 53.

In addition, because flows of gas are generated in the gap C that move from the outer side toward the inner side of the second space 33A, the liquid LQ that adheres to the overhanging part H1 of the rear surface Pb of the substrate P on the outer side of the second circumferential wall part 44 is drawn into' the second space 33A by the flows of gas generated in that gap C, and is thereby moved to and recovered by the first recovery ports 51. Namely, the provision of the second circumferential wall part 44, which along with the rear surface Pb of the substrate P forms the gap C, makes it possible to use the first recovery ports 51 to more reliably recover the liquid LQ that adheres to the overhanging part H1 of the rear surface Pb of the substrate P.

In the present embodiment, the gap C is set to 1-10 μm, but its size is preferably optimized in accordance with, for example, the force of the suction through the first recovery ports 51 and the viscosity of the liquid LQ. Optimizing the gap C in accordance with, for example, the force of the suction through the first recovery ports 51 and the viscosity of the liquid LQ makes it possible to sufficiently increase the speed of the flows of gas in the gap C and to draw the liquid LQ adhered to the overhanging part H1 into the second space 33A, and thereby to use the first recovery ports 51 to satisfactorily recover the liquid LQ.

Like the first embodiment discussed above, the operation of using the first recovery ports 51 in the present embodiment to recover the liquid LQ is stopped during the exposure of the substrate P, and is executed when the substrate P is not being exposed.

As explained above, the provision of the second circumferential wall part 44 on the outer side of the first circumferential wall part 42 makes it possible to guide the flows of gas toward the first recovery ports 51, generate desired flows of gas, satisfactorily move the liquid LQ to the first recovery ports 51 by those generated flows of gas, and to thereby recover the liquid LQ.

Figure 16:
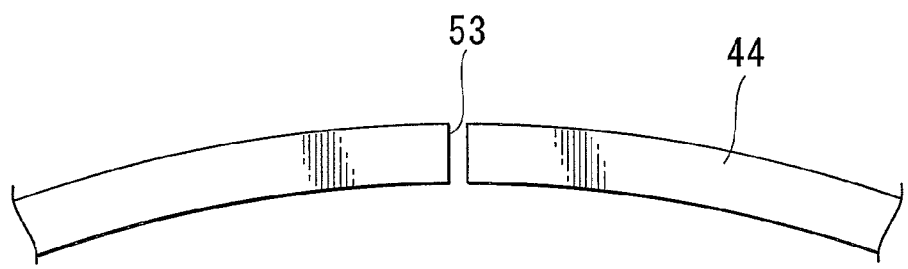
FIG. 16 is a plan view that shows one example of a slit part.
Figure 17:
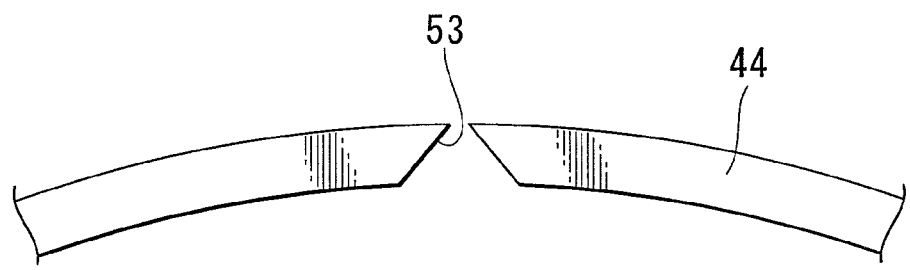
FIG. 17 is a plan view that shows another example of a slit part.
Figure 18:
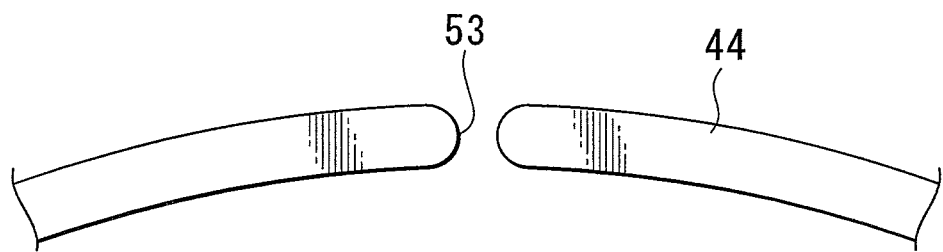
FIG. 18 is a plan view that shows another example of a slit part.

FIG. 16 is a cross sectional view taken along the XY plane in the vicinity of one of the slit parts 53 of the second circumferential wall part 44. As shown in FIG. 16, the edges of the slit part 53 are formed with substantially square corners; however, as shown in FIG. 17, the edges may be formed so that they gradually taper away from the second space 33A to the third space 33B. Alternatively, as shown in FIG. 18, the edges of the slit part 53 may be formed with curvatures.

Figure 19:
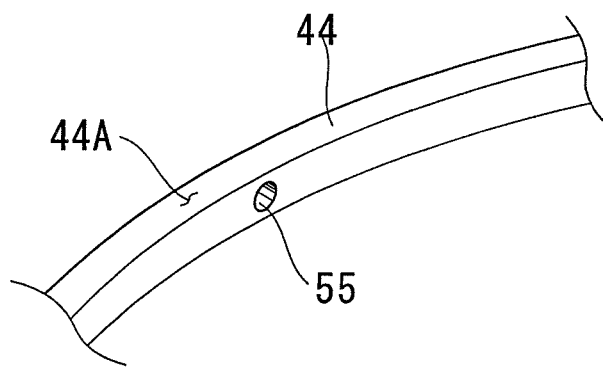
FIG. 19 is a perspective view that shows one example of a hole.

In addition, in the embodiment discussed above, the second circumferential wall part 44 is provided with the slit parts 53, which function as conduits in fluid communication between the second space 33A and the space on the outer side thereof; however, as shown in FIG. 19, a hole (through hole) 55 may be provided in one part of the second circumferential wall part 44. In addition, the hole 55 in the example shown in FIG. 19 is substantially circular, but it may be rectangular or some other shape. Namely, the shape and/or the position of the passageways can be arbitrarily set as long as gas can be flowed into the second space 33A from the space on the outer side thereof (as long as the second space 33A is left open to the atmosphere) so that flows of gas can be generated along the first circumferential wall part 42.

Furthermore, in order to generate smooth flows of gas along the first circumferential wall part 42, it is preferable that the slit parts 53 and/or the hole 55 are formed; however, it is also possible, without providing such, to generate flows of gas along the first circumferential wall part 42 by means of the gas that flows in from the gap C.

Figure 20:
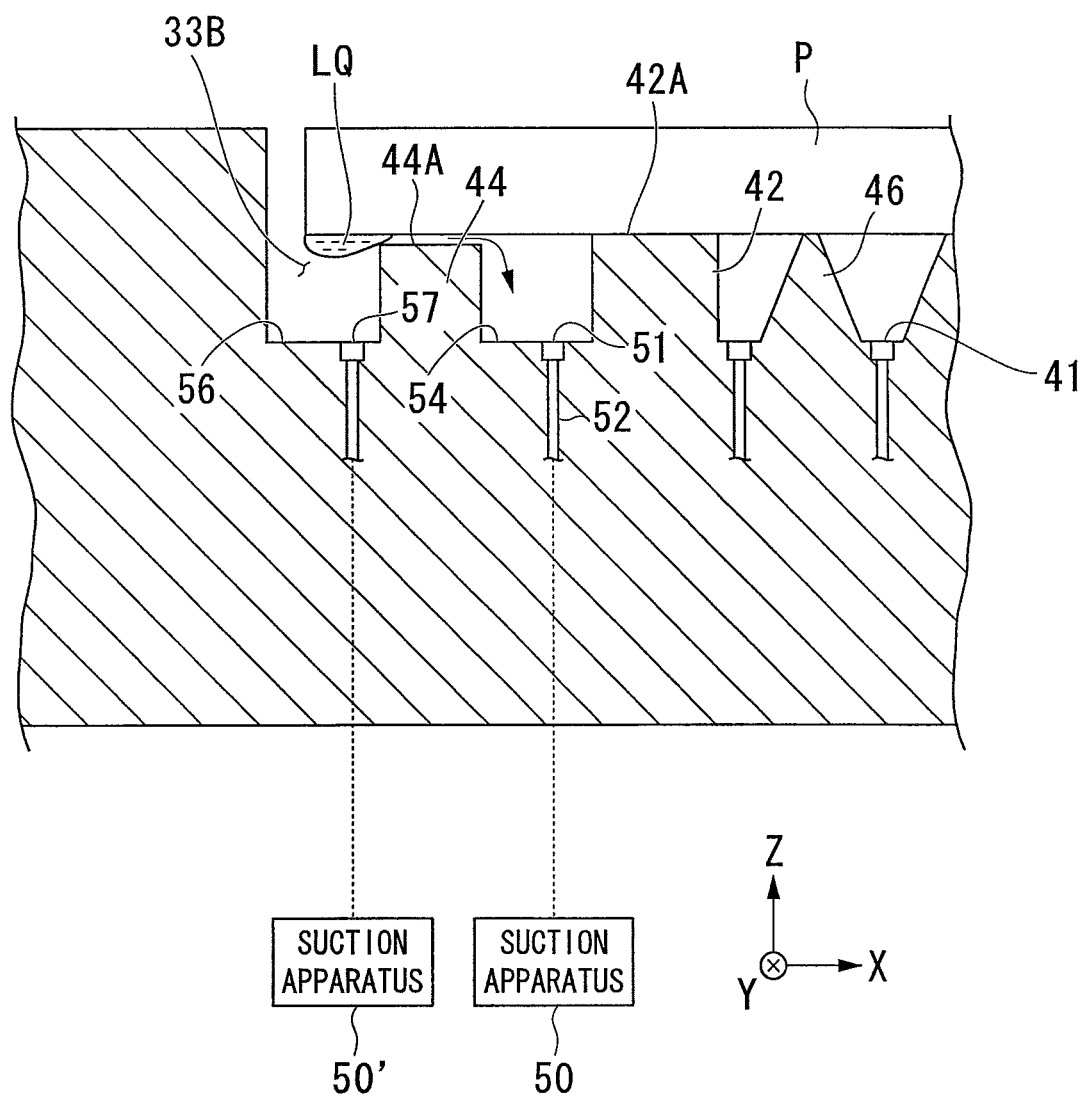
FIG. 20 shows a modified example of FIG. 13.

In addition, in the second embodiment, second recovery ports 57, which have a function equivalent to that of the first recovery ports 51, may be provided farther on the outer side of the second circumferential wall part 44 than the first recovery ports 51, as shown in FIG. 20. For example, the second recovery ports 57 can be provided to an upper surface 56 of the base PHB between the first circumferential wall part 42 and the second circumferential wall part 44. A suction apparatus 50' is connected to the second recovery ports 57 via a passageway 52'. In so doing, the liquid LQ that pools at, for example, the upper surface 56 of the third space 33B can be recovered through the second recovery ports 57. Furthermore, similar to the operation of recovering the liquid LQ using the first recovery ports 51, the operation of recovering the liquid LQ using the second recovery ports 57 is stopped during the exposure of the substrate P, and is executed when the substrate P is not being exposed.

Furthermore, when operating the suction apparatus 50 and the suction apparatus 50' simultaneously, it is preferable to operate the suction apparatus 50' with a suction force that is stronger than that of the suction apparatus 50 so that the speed of the gas flows generated in the gap C is not reduced. Alternatively, after the suction apparatus 50 is operated and the liquid LQ adhered to the overhanging part H1 of the rear surface Pb of the substrate P and/or the liquid LQ that infiltrated and adhered in the second space 33A is recovered, the suction apparatus 50' may be operated so as to recover the liquid LQ that infiltrated and adhered in the third space 33B.

Third Embodiment

Figure 21:
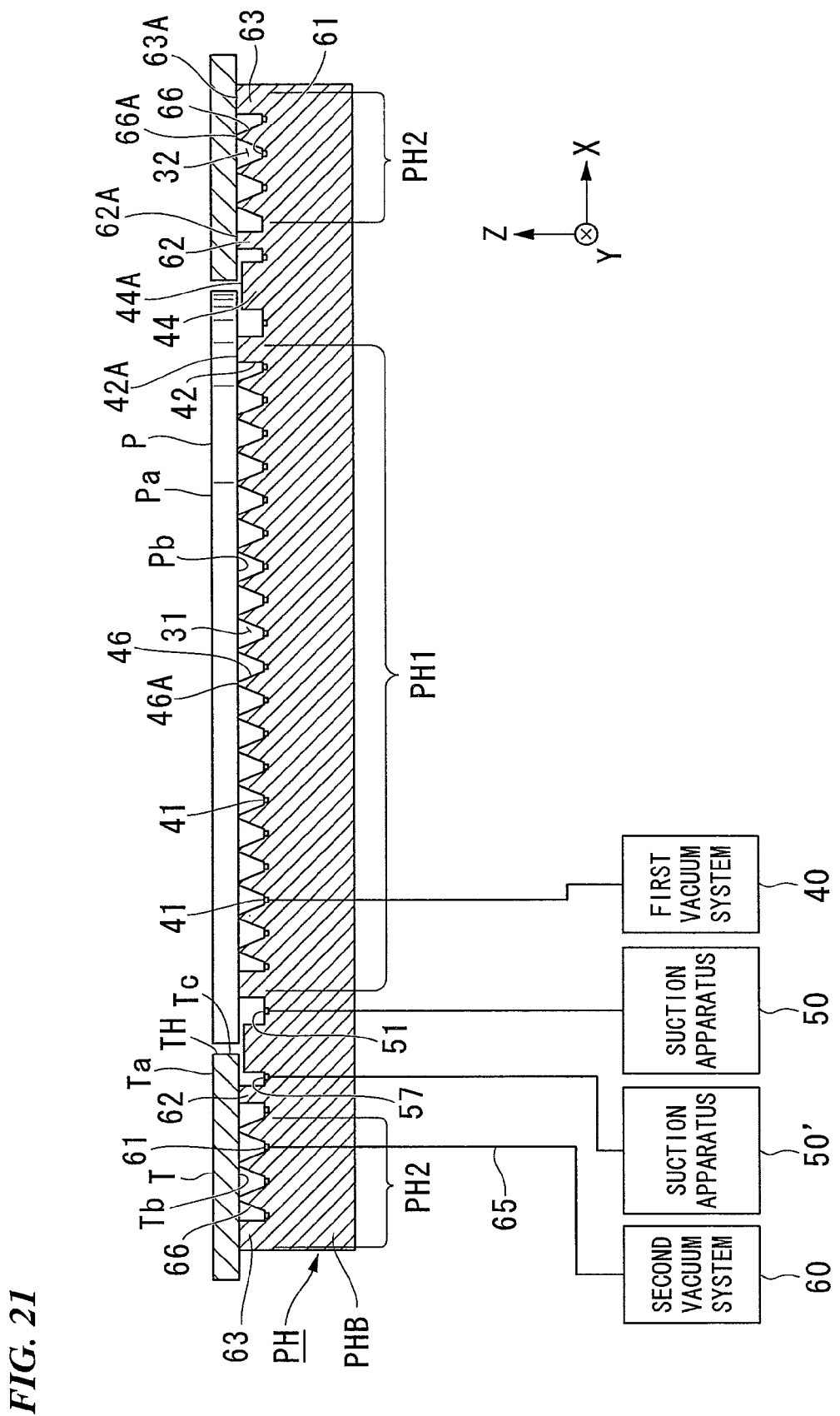
FIG. 21 is a side cross sectional view of the substrate holder according to a third embodiment.
Figure 22:
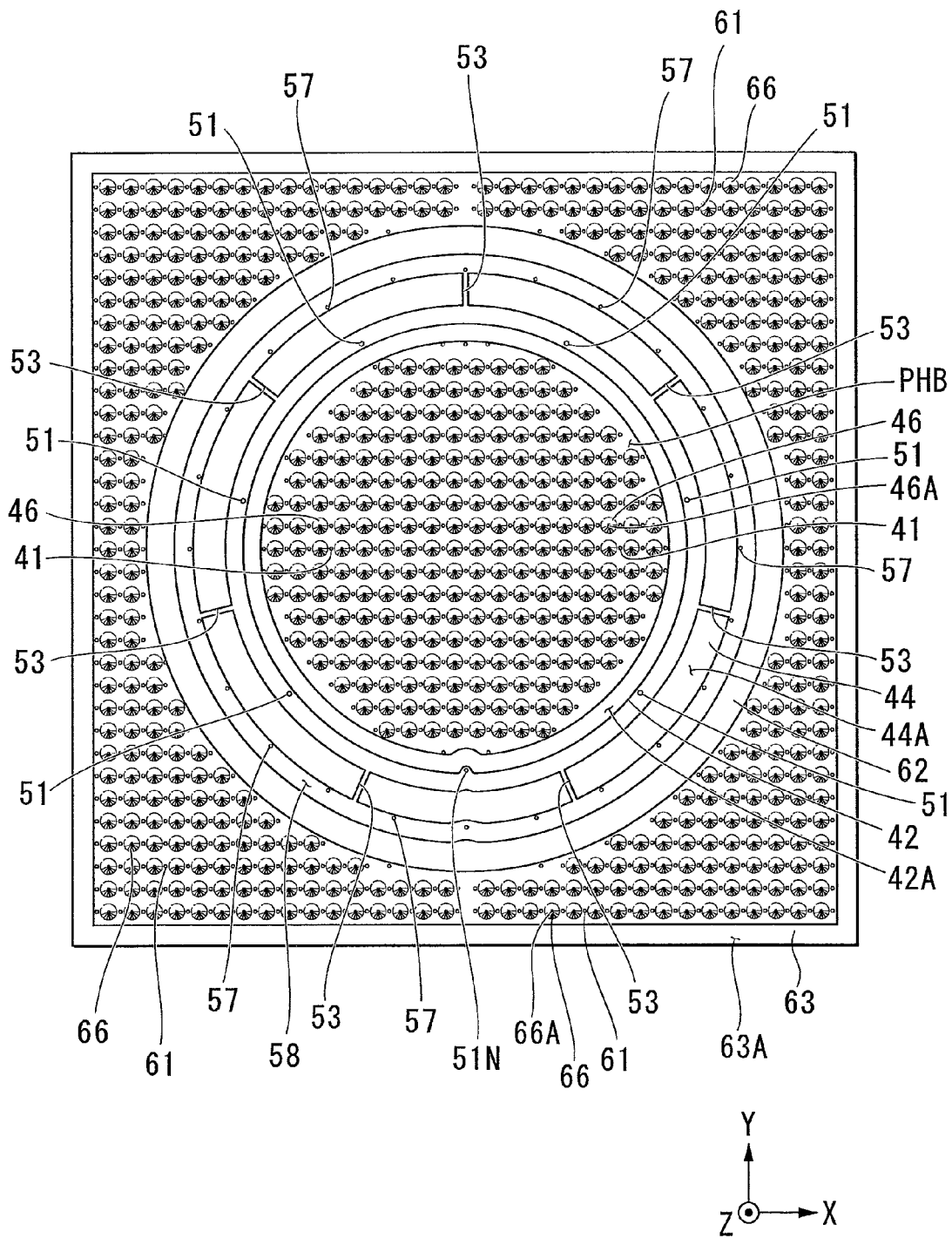
FIG. 22 is a plan view that shows a state wherein a plate member is removed from the substrate holder according to the third embodiment.
Figure 23:
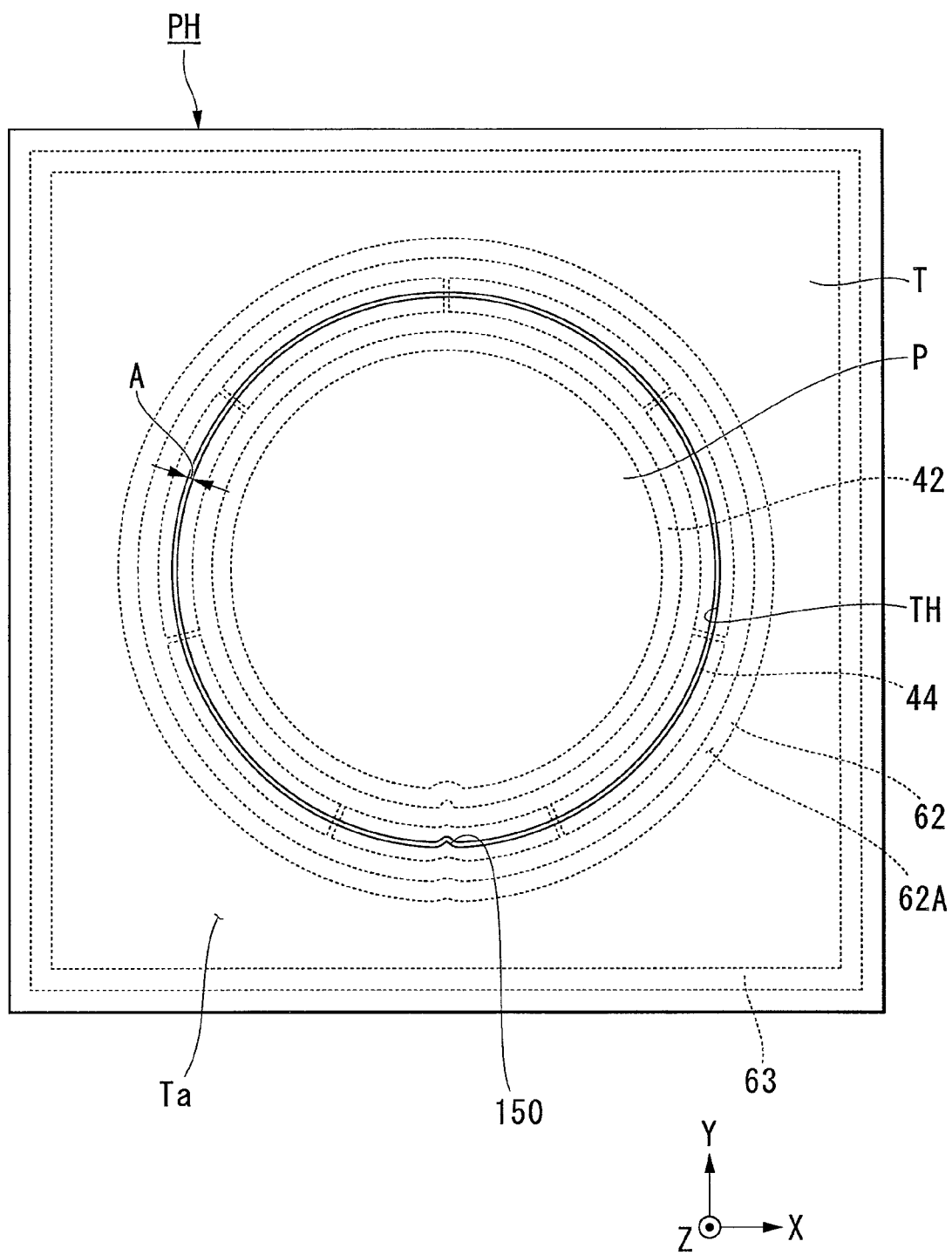
FIG. 23 is a plan view that shows a state wherein the substrate holder according to the third embodiment is holding a substrate.
Figure 24:
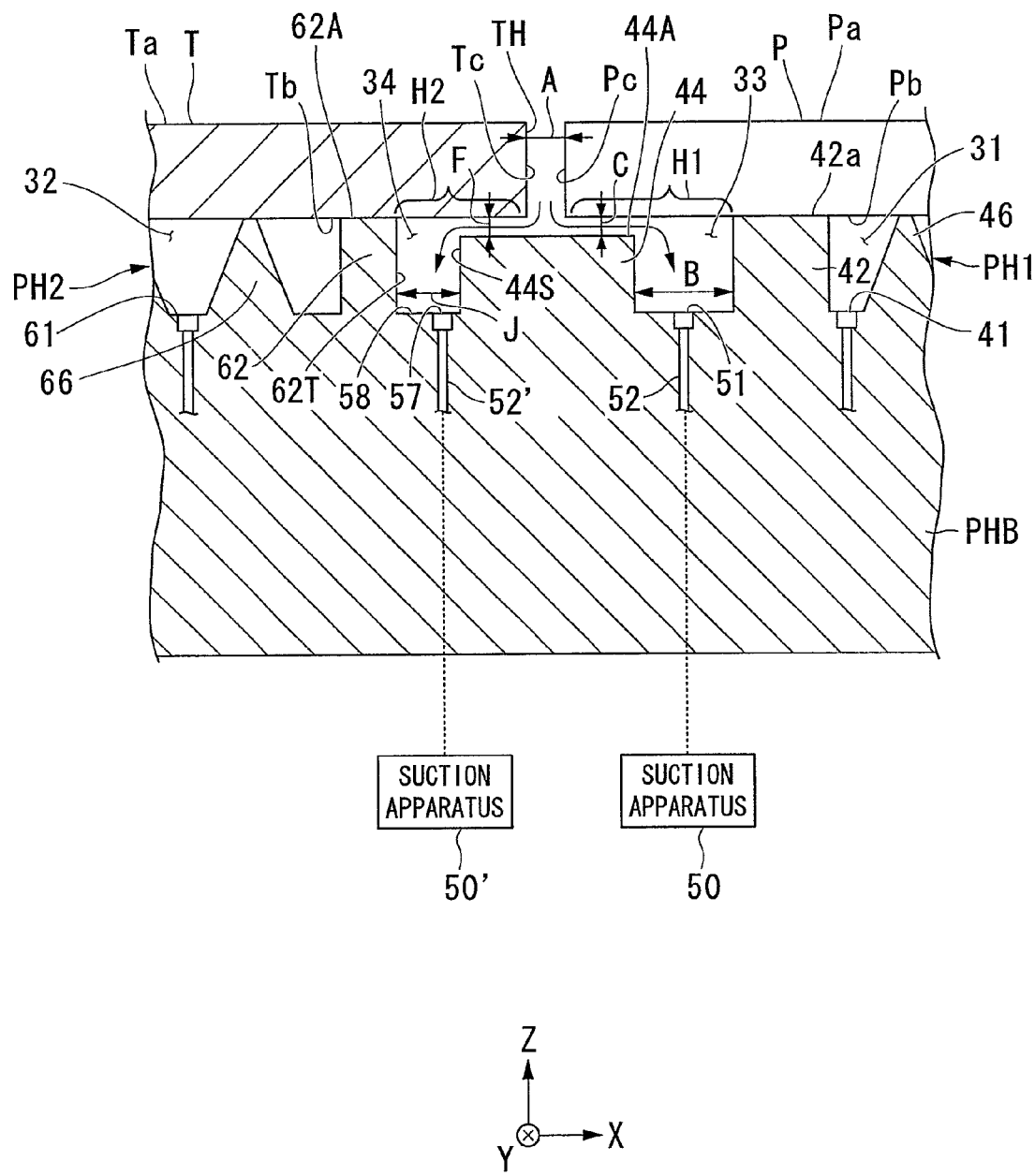
FIG. 24 is an enlarged view of the principal parts of FIG. 21.

The following explains the third embodiment, referencing FIGS. 21-24. FIG. 21 is a cross sectional view of the substrate holder PH in a state wherein it is holding a substrate P; FIG. 22 is a plan view of one part the substrate holder PH; FIG. 23 is a plan view of the substrate holder PH in a state wherein it is holding a substrate P; and FIG. 24 is an enlarged view of the principal parts of FIG. 22.

The substrate holder PH of the present embodiment comprises the base PHB, the first holding part PH1, which is formed in the base PHB and chucks the substrate P, and a second holding part PH2, which is formed in the base PHB and chucks a plate member T so that it surrounds the circumference of the substrate P chucked by the first holding part PH1. The plate member T is separate from the base PHB and is provided so that it can be detached (i.e., it is replaceable) from the second holding part PH2. In addition, as shown in FIG. 23, the plate member T is a substantially annular member, and a substantially circular opening TH, wherein the substrate P can be disposed, is formed at the center part thereof. Furthermore, the plate member T held by the second holding part PH2 is disposed so that it surrounds the circumference of the substrate P that is held by the first holding part PH1. In addition, the external form of the plate member T is shaped rectangularly in a plan view so that it follows the shape of the base PHB.

In FIG. 21, both a front surface Ta and a rear surface Tb of the plate member T are flat surfaces (flat parts). In addition, the plate member T has substantially the same thickness as the substrate P. Furthermore, the front surface (flat surface) Ta of the plate member T that is held by the second holding part PH2 is substantially flush with the front surface Pa of the substrate P that is held by the first holding part PH1. Namely, at the circumference of the substrate P that is held by the first holding part PH1, the plate member T that is held by the second holding part PH2 forms the flat surface Ta, which is substantially flush with the front surface Pa of that substrate P.

Furthermore, if it is possible to continue to fill the liquid LQ in the optical path space K1 on the image plane side of the projection optical system PL, then it is acceptable for there to be a step between the front surface Pa of the substrate P held by the first holding part PH1 and the front surface Ta of the plate member T held by the second holding part PH2.

Like the second embodiment discussed above, the first holding part PH1 of the substrate holder PH comprises the first support parts 46 formed on the base PHB, the annular first circumferential wall part 42 formed on the base PHB so that it surrounds the circumference of the first support parts 46, and the first suction ports 41 provided to the base PHB on the inner side of the first circumferential wall part 42. In addition, the second circumferential wall part 44 is provided on the outer side of the first circumferential wall part 42. The upper surface 44A of the second circumferential wall part 44 in the present embodiment is formed so that its width is greater than that of the second embodiment discussed above.

Like the second embodiment discussed above, one slit part 53 is provided at each position of a plurality of prescribed positions in the circumferential direction of the second circumferential wall part 44. In addition, like the embodiment discussed above, one first recovery port 51 is provided at each position of a plurality of prescribed positions along the first circumferential wall part 42. Furthermore, each slit part 53 is provided between adjacent first recovery ports 51.

The second holding part PH2 of the substrate holder PH comprises a substantially circular ring shaped third circumferential wall part 62, which is formed on the base PHB so that it surrounds the second circumferential wall part 44, an annular fourth circumferential wall part 63, which is provided on the outer side of the third circumferential wall part 62 and is formed on the base PHB so that it surrounds the third circumferential wall part 62, and protruding second support parts 66, which are formed on the base PHB between the third circumferential wall part 62 and the fourth circumferential wall part 63. The second support parts 66 support the rear surface Tb of the plate member T, and a plurality of second support parts 66 are uniformly formed between the third circumferential wall part 62 and the fourth circumferential wall part 63. Like the first support parts 46, the second support parts 66 in the present embodiment comprise a plurality of support pins. The third circumferential wall part 62 is provided on the outer side of the second circumferential wall part 44 with respect to the first space 31, and the fourth circumferential wall part 63 is provided farther on the outer side of the third circumferential wall part 62 with respect to the first space 131. In addition, the third circumferential wall part 62 is formed substantially as a circular ring in accordance with the shape of the opening TH of the plate member T. Moreover, the fourth circumferential wall part 63 is formed as a substantially rectangular ring in accordance with the external form of the plate member T. An upper surface 62A of the third circumferential wall part 62 is formed so that it opposes an inner edge area (an inner side edge area) of the rear surface Tb of the plate member T in the vicinity of the opening TH. An upper surface 63A of the fourth circumferential wall part 63 is formed so that it opposes an outer edge area (the outer side edge area) of the rear surface Tb of the plate member T. A fourth space 32, which is surrounded by the base PHB, the third and fourth circumferential wall parts 62, 63, and the rear surface Tb of the plate member T, is formed on the rear surface Tb side of the plate member T held by the second holding part PH2.

Second suction ports 61 are formed in the base PHB between the third circumferential wall part 62 and the fourth circumferential wall part 63. The second suction ports 61 are for the purpose of chucking the plate member T, and one second suction ports 61 is provided at each position of a plurality of prescribed positions (between the third circumferential wall part 62 and the fourth circumferential wall part 63) on the upper surface of the base PHB, excluding the areas of the second support parts 66. In the present embodiment, the plurality of second suction ports 61 are uniformly disposed between the third circumferential wall part 62 and the fourth circumferential wall part 63.

Each second suction port 61 is connected to a second vacuum system 60 through a passageway 65. The second vacuum system 60 includes a vacuum pump and is for the purpose of negatively pressurizing the fourth space 32, which is surrounded by the base PHB, the third and fourth circumferential wall parts 62, 63, and the rear surface Tb of the plate member T. As discussed above, the second support parts 66 comprise support pins and, like the first holding part PH1, the second holding part PH2 according to the present embodiment constitutes one part of the so-called pin chuck mechanism. The third and fourth circumferential wall parts 62, 63 function as outer wall parts that enclose the outer sides of the fourth space 32, which includes the second support parts 66, and the control apparatus CONT chucks the plate member T to the second support parts 66 by driving the second vacuum system 60 so as to suction the gas (air) out of the interior of the fourth space 32 that is surrounded by the base PHB, the third and fourth circumferential wall parts 62, 63, and the plate member T, thereby negatively pressurizing the fourth space 32.

The first vacuum system 40 that negatively pressurizes the first space 31 and the second vacuum system 60 that negatively pressurizes the fourth space 32 are independent of one another. The control apparatus CONT can separately control the operations of the first vacuum system 40 and the second vacuum system 60, and therefore the operation of suctioning the first space 31 via the first vacuum system 40 and the operation of suctioning the fourth space 32 via the second vacuum system 60 can be performed independently. In addition, the control apparatus CONT can control the first vacuum system 40 and the second vacuum system 60 so as to make the pressure of the first space 31 and the pressure of the fourth space 32 different from one another.

As shown in FIG. 24, the gap A of 0.1-1.0 mm is formed between the edge part (side surface Pc) on the outer side of the substrate P held by the first holding part PH1 and the edge part (side surface Tc) on the inner side (opening TH side) of the plate member T provided at the circumference of the substrate P.

In addition, as shown in FIG. 23, the shape of the plate member T is set in accordance with the external form (shape of the notched part NT) of the substrate P so that a gap that is on the same order as the gap A is also formed in the notched part NT between the substrate P and the plate member T. Specifically, a projection part 150 that projects toward the inner side of the opening TH is provided to the plate member T so that it corresponds to the shape of the notched part NT of the substrate P. Thereby, the gap A of 0.1-1.0 mm is secured between the plate member T and the entire area of the edge part of the substrate P, which includes the notched part NT. Furthermore, if the notched part NT is extremely small, then the projection part 150 need not be provided to the plate member T.

As shown in FIG. 24, the rear surface Pb of the substrate P and an area of one part of the upper surface 44A of the second circumferential wall part 44 oppose one another, and the rear surface Tb of the plate member T and another area of the upper surface 44A of the second circumferential wall part 44 oppose one another. Namely, the upper surface 44A of the second circumferential wall part 44 is disposed directly below the gap A, which is formed between the substrate P and the plate member T. In addition, the prescribed gap C is formed between the rear surface Pb of the substrate P and the upper surface 44A of the second circumferential wall part 44, and a prescribed gap F is formed between the rear surface Tb of the plate member T and the upper surface 44A of the second circumferential wall part 44.

In addition, the second recovery ports 57, which have a function that is equivalent to the first recovery ports 51, are provided farther on the outer side of the second circumferential wall part 44 than the first recovery ports 51. The suction apparatus 50' is connected to the second recovery ports 57 via the passageway 52', and the operation of suctioning through the second recovery ports 57 via the suction apparatus 50' generates flows of gas that move toward the second recovery ports 57. The gas that flows toward the second recovery ports 57 flows so that it follows an outer side surface 44S of the second circumferential wall part 44, and moves the liquid LQ on the outer side of the second circumferential wall part 44 to the second recovery ports 57, thereby recovering the liquid LQ.

The second recovery ports 57 are provided in a fifth space 34 on the rear surface Tb side of the plate member T held by the second holding part PH2. The second holding part PH2 holds the plate member T so that the fifth space 34 is formed on the rear surface Tb side of the plate member T, and the second recovery ports 57 are provided on the rear surface Tb side of the plate member T held by the second holding part PH2. In the present embodiment, the second recovery ports 57 are provided to an upper surface 58 of the base PHB between the outer side surface 44S of the second circumferential wall part 44 and an inner side surface 62T of the third circumferential wall part 62.

The inner diameter of the annular third circumferential wall part 62 of the second holding part PH2 is greater than the diameter of the opening TH of the plate member T, and the inner edge area in the vicinity of the opening TH of the plate member T overhangs the inner side (substrate P side) of the third circumferential wall part 62 by a prescribed amount, thereby forming an overhanging part H2. The second recovery ports 57 are provided at positions that oppose the overhanging part H2 of the rear surface Tb of the plate member T held by the second holding part PH2. The second recovery ports 57 are provided to the upper surface 58 of the base PHB between the second circumferential wall part 44 and the third circumferential wall part 62 at prescribed positions in the vicinity of the outer side surface 44S of the second circumferential wall part 44. In addition, one second recovery port 57 is provided at each position of a plurality of prescribed positions along the second circumferential wall part 44. Each second recovery port 57 is provided between mutually adjacent slit parts 53.

The fifth space 34 is open to the atmosphere via the gap A and the gap F, and it is possible to smoothly generate flows of gas in the gap F and the fifth space 34.

In the present embodiment, the force of suction through the gap C, the gap F, and the first recovery ports 51 and the force of suction through the second recovery ports 57 are set so that the suction force of the liquid LQ toward the gap F is greater than that toward the gap C. Here, the suction apparatus 50, which is connected to the first recovery ports 51, and the suction apparatus 50', which is connected to the second recovery ports 57, are independent of one another. The control apparatus CONT can separately control the operations of the suction apparatuses 50, 50', and therefore the suction operation through the first recovery ports 51 via the suction apparatus 50 and the suction operation through the second recovery ports 57 via the suction apparatus 50' can be performed independently. In addition, the control apparatus CONT can control the suction apparatus 50 and the suction apparatus 50' so as to make the suction force through the first recovery ports 51 and the suction force through the second recovery ports 57 different from one another.

Returning to FIG. 21, the upper surface 63A of the fourth circumferential wall part 63 is a flat surface, and the fourth circumferential wall part 63 is formed so that it is slightly lower than the second support parts 66. Furthermore, a prescribed gap is formed between the upper surface 63A of the fourth circumferential wall part 63 and the rear surface Tb of the plate member T. In addition, the plate member T is formed so that it is larger than the external form of the fourth circumferential wall part 63, and the outer edge area of the plate member T overhangs the outer side of the fourth circumferential wall part 63 by a prescribed amount. If the liquid LQ on the plate member T flows out to the outer side of the plate member T, then there is a risk that the liquid LQ will adhere to the movable mirrors 93 provided to the side surfaces of the substrate holder PH, but the liquid LQ that flows out to the outer side of the plate member T is prevented from adhering to the movable mirrors 93 because the plate member T overhangs the outer side of the fourth circumferential wall part 63 as well as the outer side of the movable mirrors 93. In addition, because a gap is formed between the plate member T and the upper surface 63A of the fourth circumferential wall part 63, the negative pressurization of the fourth space 32 by the second vacuum system 60 generates flows of gas that move through that gap from the outer side to the inner side of the fourth space 32. Accordingly, the liquid LQ that flows out to the outer side of the plate member T is drawn into the fourth space 32 through the gap before it flows to (before it adheres to) the side surfaces of the substrate holder PH that include the movable mirrors 93. Accordingly, it is possible to more reliably prevent the problem wherein the liquid LQ adheres to the movable mirrors 93.

The front surface Ta, the rear surface Tb, and the side surface Tc of the plate member T are each coated with a liquid repellent material that is liquid repellent with respect to the liquid LQ. Examples of liquid repellent materials include acrylic resin materials and fluororesin materials such as polytetrafluoroethylene. Alternatively, if the plate member T is made of quartz, then it can be coated with "Cytop®," which is made by Asahi Glass Co. Furthermore, to make the plate member T liquid repellent, the plate member T itself may be formed from a liquid repellent material (a fluorine based material and the like).

In addition, the upper surface 62A and the inner side surface 62T of the third circumferential wall part 62 of the second holding part PH2 and an upper surface 66A of each second support part 66 are also liquid repellent. Examples of processes for giving the substrate holder PH liquid repellency treatment include coating it with, for example, a fluororesin material, an acrylic resin material, or a topcoat layer forming material, as discussed above.

In addition, the third circumferential wall part 62 is formed so that it is substantially the same height as or slightly lower than the second support parts 66, and, in a state wherein the plate member T is held by the second support parts 66, the rear surface Tb of the plate member T and the upper surface 62A of the third circumferential wall part 62 are substantially tightly sealed.

The following explains the operation of recovering the liquid LQ using the substrate holder PH according to the third embodiment.

If the liquid LQ infiltrates through the gap A between the substrate P and the plate member T, then there is a possibility that the infiltrated liquid LQ will flow into the second space 33 through the gap C or into the fifth space 34 through the gap F, as shown in FIG. 24.

The liquid LQ that infiltrates any one of the second space 33 and the fifth space 34 through the gap A can be recovered by driving at least one of the suction apparatus 50 and the suction apparatus 50'.

For example, driving the suction apparatus 50 generates flows of gas in the vicinity (second space 33) of the first recovery ports 51 along the first circumferential wall part 42 that move toward the first recovery ports 51, and those flows of gas can recover the liquid LQ through the first recovery ports 51. Here, like the second embodiment, the second circumferential wall part 44 is provided with a function that guides the flows of gas, which move toward the first recovery ports 51, on the outer side of the first circumferential wall part 42. Accordingly, the operation of suctioning through the first recovery ports 51 via the suction apparatus 50 makes it possible to satisfactorily generate flows of gas that move toward the first recovery ports 51.

In addition, the slit parts 53 formed in the gap C and the second circumferential wall part 44 are slits for fluid communication between the second space 33 and a space (atmospheric space) on the outer side thereof. Namely, because the second space 33 is open to the atmosphere via the gap C, the slit parts 53, and the gap A, gas flows from the exterior to the interior of the second space 33 through the gap C, the slit parts 53, and the gap A even if the gas is suctioned out of the second space 33 through the first recovery ports 51, which makes it possible to smoothly generate the desired flows of gas.

In addition, like the second embodiment, flows of gas are generated in the gap C that move from the outer side to the inner side of the second space 33, and the liquid LQ that pools in the gap C is drawn into the second space 33 by those flows of gas and is smoothly moved to the first recovery ports 51 where it is recovered.

Moreover, the drive of the suction apparatus 50' generates flows of gas in the vicinity (fifth space 34) of the second recovery ports 57 that move toward the second recovery ports 57, and the liquid LQ can be recovered through the second recovery ports 57 by those flows of gas. At this time, the second circumferential wall part 44 is provided with a function that guides the flows of gas, which move toward the second recovery ports 57, on the outer side of the second circumferential wall part 44. Accordingly, the operation of suctioning through the second recovery ports 57 via the suction apparatus 50' makes it possible to satisfactorily generate flows of gas that move toward the second recovery ports 57.

Namely, the fifth space 34, which is in a gap J that is set to approximately 1 mm, is formed between the second circumferential wall part 44 and the third circumferential wall part 62, and the operation of suctioning through the second recovery ports 57 via the suction apparatus 50' makes it possible to generate high speed flows of gas that move toward the second recovery ports 57 in the grooved fifth space 34. In addition, like the gap B, the gap J is preferably set to approximately 0.5-1.5 mm in order to generate high speed flows of gas.

Furthermore, because the fifth space 34 is open to the atmosphere via the gap F, the slit parts 53, and the gap A, the gas flows from the exterior to the interior of the fifth space 34 through the gap F, the slit parts 53, and/or the gap A even if the gas is suctioned out of the fifth space 34 through the second recovery ports 57, thus making it possible to smoothly generate the desired flows of gas.

In addition, like the gap C, the gap F is set to 1-10 mm and flows of gas are generated therein that move from the outer side toward the inner side of the fifth space 34; therefore, the liquid LQ that pools in the gap F is drawn into the fifth space 34 by those flows of gas, which makes it possible to smoothly move the liquid LQ to the second recovery ports 57 and thereby recover the liquid LQ.

Thus, the first recovery ports 51 and the second recovery ports 57 can recover the liquid LQ that infiltrates from the gap A between the substrate P and the plate member T. Furthermore, because the second circumferential wall part 44 is provided with a function that guides the flows of gas that move toward the first recovery ports 51 and a function that guides the flows of gas that move toward the second recovery ports 57, the desired flows of gas can be generated.

Like the embodiments discussed above, the operation of recovering the liquid LQ using the first recovery ports 51 and the second recovery ports 57 is stopped during the exposure of the substrate P, and is executed when the substrate P is not being exposed.

When recovering the liquid LQ that infiltrates from the gap A after the exposure of the substrate P is complete, the control apparatus CONT drives the suction apparatus 50 and the suction apparatus 50' and can thereby perform the operation of recovering the liquid LQ using the first recovery ports 51 and the operation of recovering the liquid LQ using the second recovery ports 57 in parallel.

Alternatively, when recovering the liquid LQ that infiltrates from the gap A after the exposure of the substrate P is complete, the control apparatus CONT can first drive the suction apparatus 50' to perform the operation of recovering the liquid LQ using the second recovery ports 57, and then drive the suction apparatus 50 to perform the operation of recovering the liquid LQ using the first recovery ports 51. Alternatively, the control apparatus CONT can perform the operation of recovering the liquid LQ using the first recovery ports 51 and then perform the operation of recovering the liquid LQ using the second recovery ports 57.

In the present embodiment, the force of the suction through the gap C, the gap F, and the first recovery ports 51 and the force of the suction through the second recovery ports 57 are set so that the force of the suction of the liquid LQ toward the gap F is greater than the force of the suction of the liquid LQ toward the gap C. Accordingly, the liquid LQ that infiltrates from the gap A can be smoothly drawn to the rear surface Tb side of the plate member T, which makes it possible to prevent the problem wherein the liquid LQ that infiltrates from the gap A travels around to the rear surface Pb side of the substrate P. Furthermore, as discussed above, because the rear surface Pb of the substrate P and the upper surface 42A of the first circumferential wall part 42 contact one another (i.e., they are tightly sealed), it is possible to prevent the liquid LQ that infiltrates from the gap A from infiltrating the first space 31 through a space between the rear surface Pb of the substrate P and the upper surface 42A of the first circumferential wall part 42.

Furthermore, in the third embodiment as well, the slit parts 53 of the second circumferential wall part 44 may be omitted, and the flows of gas along the second circumferential wall part 44 and the third circumferential wall part 62 may be generated by the gas that flows in from the gap C and the gap F.

Other Embodiments

Furthermore, in the first through third embodiments discussed above, the flows of gas that move toward the first recovery ports 51 are generated by the suctioning of gas through the first recovery ports 51 via the suction apparatus 50; however, for example, a gas supply apparatus that has gas blow out ports that are capable of generating flows of gas that move along the outer side surface 42S of the first circumferential wall part 42 may be provided, and the flows of gas that move toward the first recovery ports 51 may be generated by the gas that blows out from those gas blow out ports. Likewise, the flows of gas that move toward second recovery ports 57 may be generated by the gas that flows out from the gas blow out ports.

Furthermore, the positions and/or the number of the first recovery ports 51 are not limited to the examples discussed above. For example, in the first through third embodiments discussed above, the first recovery ports 51 are provided to the upper surface 54 of the base PHB on the outer side of the first circumferential wall part 42, but they may be provided to one part of the outer side surface 42S of the first circumferential wall part 42.

In addition, in the first through third embodiments discussed above, the first recovery ports 51 are provided in the vicinity of the first circumferential wall part 42, but they may be provided at a position spaced apart from the first circumferential wall part 42. Even if the first recovery ports 51 are provided at a position that is spaced apart from the first circumferential wall part 42, the liquid LQ can be recovered using the first recovery ports 51 as long as they are positioned so that they oppose the overhanging part H1 of the substrate P.

Furthermore, in the first through third embodiments discussed above, one first recovery port 51 is provided at each position of a plurality of prescribed positions along the first circumferential wall part 42; however, just one first recovery port 51 may be provided.

Furthermore, in the first through third embodiments discussed above, the recessed part 42N of the first circumferential wall part 42 is formed so that it matches the notched part NT formed in the substrate P, as shown in, for example, FIG. 9, and the first recovery port 51N is formed on the inner side of that recessed part 42N, but one recessed part 42N may be provided to the first circumferential wall part 42 at each location of a plurality of locations at prescribed spacings, and all or some of the first recovery ports 51 may be disposed on the inner side of the recessed parts 42N. In this case, if just one first recovery port 51 is provided, then it is preferable to leave just the first recovery port 51N on the inner side of the recessed parts 42N, which is formed in the first circumferential wall part 42 and matches the notched part NT formed in the substrate P.

Furthermore, although a pin chuck mechanism is employed when chucking the substrate P in the first through third embodiments discussed above, other chuck mechanisms may be employed. Likewise, although a pin chuck mechanism is employed when chucking the plate member T in the third embodiment, other chuck mechanisms may be employed. In addition, although vacuum chuck mechanisms may be employed when chucking both the substrate P and the plate member T, at least one of them may be held by using another mechanism such as an electrostatic chuck mechanism.

In addition, in each of the embodiments discussed above, the upper surface 42A of the first circumferential wall part 42 is formed so that it is lower than that of the upper surface 46A of each first support part 46, but the upper surface 42A of the first circumferential wall part 42 and the upper surface 46A of the first support part 46 may be the same height. In this case, the infiltration of the liquid LQ into the first space 31 can be more reliably suppressed by more tightly sealing the upper surface 46A of each first support part 46 and the rear surface Pb of the substrate P.

In addition, in the third embodiment discussed above, the upper surface 62A of the third circumferential wall part 62 is formed so that it is lower than that of the upper surface 66A of each second support part 66, but the third circumferential wall part 62 and the upper surface 66A of the second support part 66 may be the same height. In this case, it is possible to suppress the infiltration of the liquid LQ into the fourth space 32 by more tightly sealing the upper surface 62A of the third circumferential wall part 62 and the rear surface Pb of the substrate P.

As discussed above, the liquid LQ in the present embodiment is pure water. Pure water is advantageous because it can be easily obtained in large quantities at, for example, a semiconductor fabrication plant, and does not adversely impact, for example, the optical element (lens) and the photoresist on the substrate P. In addition, because pure water does not adversely impact the environment and has an extremely low impurity content, it can also be expected to have the effect of cleaning the front surface Pa of the substrate P and the surface of the optical element provided to the front surface of the projection optical system PL. Furthermore, the exposure apparatus EX may be provided with an ultrapure water manufacturing apparatus if the pure water supplied from, for example, the plant is of low purity.

Further, the refractive index n of pure water (water) with respect to the exposure light EL that has a wavelength of approximately 193 nm is said to be substantially 1.44; therefore, the use of ArF excimer laser light (193 nm wavelength) as the light source of the exposure light EL shortens the wavelength on the substrate P to 1/n, i.e., approximately 134 nm, and thereby a high resolution is obtained. Furthermore, because the depth of focus increases approximately n times, i.e., approximately 1.44 times, that of in air, the numerical aperture of the projection optical system PL can be further increased if it is preferable to ensure a depth of focus that is approximately the same as that when used in air, and the resolution is also improved from this standpoint. Furthermore, the liquid LQ is not limited to pure water, and may be a liquid that has a high refractive index of, for example, 1.6-2.0.

In the present embodiment, the optical element LS1 is affixed to the front of the projection optical system PL, and can adjust the optical characteristics of the projection optical system PL, e.g., aberrations (spherical aberration, coma aberration, and the like). Furthermore, the optical element LS1 affixed to the front of the projection optical system PL may also be an optical plate used to adjust the optical characteristics of the projection optical system PL. Alternatively, it may be a plane parallel plate that is capable of transmitting the exposure light EL therethrough.

Furthermore, if high pressure is generated by the flow of the liquid LQ between the substrate P and the optical element LS1 at the front of the projection optical system PL, then instead of making that optical element replaceable, it may be firmly fixed by that pressure so that it does not move.

Furthermore, the present embodiment is constituted so that the liquid LQ is filled between the projection optical system PL and the front surface Pa of the substrate P, but it may be constituted so that the liquid LQ is filled in a state wherein, for example, a cover glass comprising a plane parallel plate is affixed to the front surface Pa of the substrate P.

In addition, the projection optical system of the embodiments discussed above fills the liquid in the space of the optical path on the image plane side of the front optical element, but it is also possible to employ a projection optical system that also fills the liquid in the space of the optical path on the mask side of the front optical element, as disclosed in PCT International Publication No. WO2004/019128.

Furthermore, although the liquid LQ in the present embodiment is water, it may be a liquid other than water; for example, if the light source of the exposure light EL is an $F_2$ laser, then this $F_2$ laser light will not transmit through water, so it would be acceptable to use a fluorine based fluid that is capable of transmitting $F_2$ laser light, such as perfluorinated polyether (PFPE) or fluorine based oil, as the liquid LQ. In this case, the parts of the projection optical system PL that make contact with the liquid LQ are treated so as to make them lyophilic by forming a thin film with, for example, a substance that has a molecular structure that contains fluorine and has low polarity. In addition, it is also possible to use a liquid (e.g., cedar oil) that is transparent to the exposure light EL, has the highest possible refractive index, and is stable with respect to the projection optical system PL and/or the photoresist coated on the front surface Pa of the substrate P as the liquid LQ. In this case as well, the surface treatment is performed in accordance with the polarity of the liquid LQ used.

Furthermore, the substrate P in each of the abovementioned embodiments is not limited to a semiconductor wafer for fabricating semiconductor devices, and is also applicable to, for example, a glass substrate for a display device, a ceramic wafer for a thin film magnetic head, and a mask or the original plate of a reticle (synthetic quartz or a silicon wafer) used by an exposure apparatus.

The exposure apparatus EX can also be adapted to a step-and-scan type scanning exposure apparatus (scanning stepper) that scans and exposes the pattern of the mask M by synchronously moving the mask M and the substrate P, as well as to a step-and-repeat type projection exposure apparatus (stepper) that performs full field exposure of the pattern of the mask M with the mask M and the substrate P in a stationary state, and sequentially steps the substrate P.

In the embodiments discussed above, a light transmitting type mask (reticle) is used wherein a prescribed shielding pattern (or a phase pattern or a dimming pattern) is formed on a light transmitting substrate; however, instead of this reticle, it is also possible to use an electronic mask wherein a transmittance pattern, a reflected pattern, or a light emitting pattern is formed based on electronic data of the pattern to be exposed, as disclosed in, for example, U.S. Pat. No. 6,778,257. In addition, by forming interference fringes on a wafer W, as disclosed in PCT International Publication No. WO2001/035168, the present invention can also be adapted to an exposure apparatus (lithographic system) that forms a line-and-space pattern on that wafer W.

In addition, the exposure apparatus EX can also be adapted to an exposure apparatus that uses a projection optical system (e.g., a dioptric projection optical system, which does not include a reflecting element, with a ⅛ reduction magnification) to perform full field exposure of a reduced image of a first pattern onto the substrate P in a state wherein the first pattern and the substrate P are substantially stationary. In this case, the exposure apparatus EX can also be adapted to a stitching type full field exposure apparatus that subsequently further uses that projection optical system to perform full field exposure of a reduced image of a second pattern, in a state wherein the second pattern and the substrate P are substantially stationary, onto the substrate P so that the second pattern partially overlaps the first. In addition, the stitching type exposure apparatus can also be adapted to a step-and-stitch type exposure apparatus that transfers at least two patterns onto the substrate P so that they partially overlap, and sequentially steps the substrate P.

In addition, the present invention can also be adapted to a twin stage type exposure apparatus as disclosed in, for example, Japanese Unexamined Patent Application, Publication No. H10-163099, Japanese Unexamined Patent Application, Publication No. H10-214783, and Published Japanese Translation No. 2000-505958 of the PCT International Publication.

Furthermore, as disclosed in Japanese Unexamined Patent Application, Publication No. H11-135400, the present invention can also be adapted to an exposure apparatus that is provided with a substrate stage that holds the substrate, and a measurement stage whereon, for example, a fiducial member (wherein a fiducial mark is formed) and various photoelectric sensors are mounted.

In addition, in the embodiments discussed above, an exposure apparatus is employed that locally fills the liquid between the projection optical system PL and the substrate P; however, the present invention can also be adapted to a liquid immersion exposure apparatus that exposes the entire front surface of a substrate to be exposed in a state wherein the substrate is immersed in liquid, as disclosed in, for example, Japanese Unexamined Patent Application, Publication No. H6-124873, Japanese Unexamined Patent Application, Publication No. H10-303114, and U.S. Pat. No. 5,825,043.

The type of exposure apparatus EX is not limited to semiconductor device fabrication exposure apparatuses that expose the pattern of a semiconductor device on the substrate P, but can also be widely adapted to exposure apparatuses for fabricating liquid crystal display devices or displays, and exposure apparatuses for fabricating, for example, thin film magnetic heads, imaging devices (CCDs), or reticles and masks.

If a linear motor is used in the substrate stage PST and/or the mask stage MST (refer to U.S. Pat. No. 5,623,853 and U.S. Pat. No. 5,528,118), then either an air levitation type that uses an air bearing, or a magnetic levitation type that uses Lorentz's force or reactance force may be used. In addition, each of the stages PST, MST may be a type that moves along a guide, or may be a guideless type.

For the drive mechanism of each of the stages PST, MST, a planar motor may be used wherein a magnet unit, in which magnets are arranged two dimensionally, and an armature unit, in which coils are arranged two dimensionally, are opposed to one another, and each of the stages PST, MST are driven by electromagnetic force. In this case, for each of the stages PST, MST, either the magnet unit or the armature unit is connected to the stage, and the other is provided to the moving surface side of the relevant stage.

The reaction force generated by the movement of the substrate stage PST may be mechanically discharged to the floor (ground) by using a frame member so that it is not transmitted to the projection optical system PL, as recited in Japanese Unexamined Patent Application, Publication No. H08-166475 (U.S. Pat. No. 5,528,118).

The reaction force generated by the movement of the mask stage MST may be mechanically discharged to the floor (ground) by using a frame member so that it is not transmitted to the projection optical system PL, as recited in Japanese Patent Application, Publication No. H08-330224 (U.S. Pat. No. 5,874,820).

The exposure apparatus EX in the present embodiments is manufactured by assembling various subsystems, including each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes the mutual mechanical connection of the various subsystems, the wiring and connection of electrical circuits, the piping and connection of the atmospheric pressure circuit, and the like. Naturally, before the process of assembling the exposure apparatus from these various subsystems, there are also the processes of assembling each individual subsystem. When the process of assembling the exposure apparatus from the various subsystems is complete, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 25:
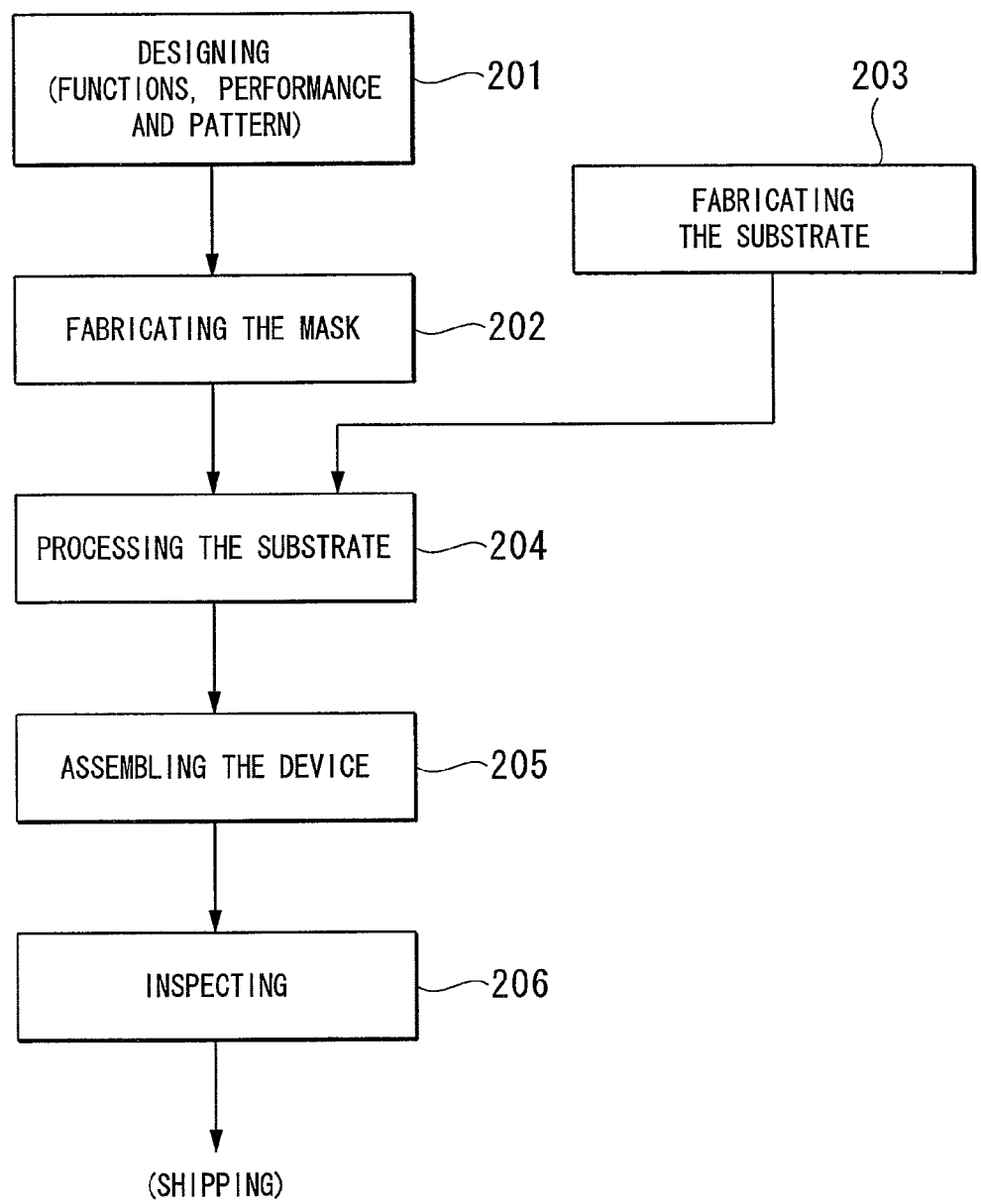
FIG. 25 is a flow chart diagram that shows one example of a process for fabricating a microdevice.

As shown in FIG. 25, a micro-device, such as a semiconductor device, is manufactured by: a step 201 that designs the functions and performance of the micro-device; a step 202 that fabricates a mask (reticle) based on this design step; a step 203 that fabricates a substrate, which is the base material of the device; a step 204 that includes a process wherein the exposure apparatus EX of the embodiments discussed above exposes a pattern of the mask onto the substrate; a device assembling step 205 (comprising a dicing process, a bonding process, and a packaging process); an inspecting step 206; and the like.

The invention claimed is:
1. An exposure apparatus that exposes a substrate to light passing through liquid, the apparatus comprising:
 a stage that holds the substrate; and
 a liquid supply system that supplies the liquid onto the stage holding the substrate,
 wherein the stage comprises:
 a substrate holder that holds the substrate, the substrate holder including a support member that supports a rear surface of the substrate and a first circumferential wall that surrounds the support member and faces the rear surface of the substrate on the support member;
 a second circumferential wall that surrounds the substrate holder and forms a first groove and a second groove, the first groove being located between the second circumferential wall and the substrate holder, the second groove being located on an outer side of the second circumferential wall;
 a plate member that surrounds the substrate on the support member; and
 a recovery passage that recovers liquid flowing from the liquid supply system to a gap between the plate member and the substrate on the support member, the recovery passage having recovery ports located below the gap, and
 wherein the second circumferential wall is arranged under the gap so that a part of an upper surface of the second circumferential wall faces the rear surface of the substrate on the support member and another part of the upper surface of the second circumferential wall faces a rear surface of the plate member.

2. The exposure apparatus according to claim 1, wherein the first groove is located so as to face the substrate on the support member, and the second groove is located so as to face the plate member.

3. The exposure apparatus according to claim 1, wherein the recovery ports are arranged along the second circumferential wall.

4. The exposure apparatus according to claim 1, wherein the recovery ports are arranged so as to generate a flow of liquid which moves from the gap to the second groove.

5. The exposure apparatus according to claim 1, wherein the recovery ports are arranged so as to face a space of the second groove.

6. The exposure apparatus according to claim 1, wherein the liquid supply system has a liquid supply port for supplying the liquid onto the stage holding the substrate, the liquid supply port being provided so as to face a surface of the substrate on the support member.

7. The exposure apparatus according to claim 1, further comprising a liquid recovery system which is located above the substrate holder and has an upper recovery port for recovering liquid supplied from the liquid supply system.

8. The exposure apparatus according to claim 7, wherein the upper recovery port is provided so as to face a surface of the substrate on the support member.

9. The exposure apparatus according to claim 1, wherein the substrate holder is configured to hold the substrate on the support member by applying a negative pressure to a space surrounded by the first circumferential wall via a gas flow channel connected to the space surrounded by the first circumferential wall.

10. The exposure apparatus according to claim 1, wherein a height of an upper surface of the first circumferential wall is lower than a height of an upper surface of the support member.

11. The exposure apparatus according to claim 1, wherein at least a part of the stage is liquid-repellent.

12. An exposure method for exposing a substrate to light passing through liquid, the method comprising:

providing an exposure apparatus according to claim 1 with the substrate; and exposing the substrate by use of the exposure apparatus.

13. A device manufacturing method comprising:

exposing a pattern onto a substrate by use of an exposure apparatus according to claim 1; and assembling a device from the substrate onto which the pattern has been exposed.

* * * * *